(12) United States Patent
Takada et al.

(10) Patent No.: US 12,356,738 B2
(45) Date of Patent: Jul. 8, 2025

(54) SEMICONDUCTOR APPARATUS AND DEVICE

(71) Applicant: CANON KABUSHIKI KAISHA, Tokyo (JP)

(72) Inventors: Yoshiaki Takada, Kanagawa (JP); Hajime Ikeda, Kanagawa (JP); Keisuke Ota, Tokyo (JP); Yoichiro Handa, Oita (JP)

(73) Assignee: Canon Kabushiki Kaisha, Tokyo (JP)

( * ) Notice: Subject to any disclaimer, the term of this patent is extended or adjusted under 35 U.S.C. 154(b) by 517 days.

(21) Appl. No.: 17/751,406

(22) Filed: May 23, 2022

(65) Prior Publication Data

US 2022/0285410 A1    Sep. 8, 2022

Related U.S. Application Data

(63) Continuation of application No. PCT/JP2020/043250, filed on Nov. 19, 2020.

(30) Foreign Application Priority Data

Nov. 25, 2019 (JP) ................................. 2019-212300

(51) Int. Cl.
  *H10F 39/00* (2025.01)
  *H10F 39/18* (2025.01)

(52) U.S. Cl.
  CPC ......... *H10F 39/802* (2025.01); *H10F 39/182* (2025.01); *H10F 39/8053* (2025.01);
  (Continued)

(58) Field of Classification Search
  CPC ......... H01L 27/14603; H01L 27/14621; H01L 27/14623; H01L 27/14627; H01L 27/1463; H01L 27/14645
  See application file for complete search history.

(56) References Cited

U.S. PATENT DOCUMENTS

2009/0286346 A1* 11/2009 Adkisson ............... H10F 39/806
                                                                257/E31.13
2012/0235036 A1*  9/2012 Hatakeyama ........... H01J 37/20
                                                                250/310

(Continued)

FOREIGN PATENT DOCUMENTS

JP          2010219355 A      9/2010
JP          2010225818 A     10/2010
(Continued)

OTHER PUBLICATIONS

Manuel Innocent, et al.; "Pixel With Nested Photo Diodes and 120 dB Single Exposure Dynamic Range;" ON Semiconductor, Schaliënhoevedreef 20B, 2800 Mechelen, Belgium; pp. 1-4.

*Primary Examiner* — Monica D Harrison
*Assistant Examiner* — Andre C Stevenson
(74) *Attorney, Agent, or Firm* — Canon U.S.A., Inc. IP Division

(57) ABSTRACT

A photoelectric conversion member included in a photodiode PD2 is disposed at the position overlapping with a section B1, a photoelectric conversion member included in a photodiode PD1 is disposed at the position overlapping with a section B2, and a photoelectric conversion member included in the photodiode PD1 is disposed at the position overlapping with a section B3. A plurality of electrodes 25 each forming a Metal-Insulator-Semiconductor (MIS) structure together with a semiconductor layer 10 is disposed on a front surface FS of the semiconductor layer 10. At least one of the plurality of electrodes 25 overlaps with at least one of eight sections B2 to B9.

27 Claims, 16 Drawing Sheets

(52) U.S. Cl.
CPC ..... *H10F 39/8057* (2025.01); *H10F 39/8063* (2025.01); *H10F 39/807* (2025.01)

(56) References Cited

U.S. PATENT DOCUMENTS

| | | |
|---|---|---|
| 2017/0366769 A1 | 12/2017 | Mlinar |
| 2019/0020835 A1 | 1/2019 | Takahashi |
| 2019/0131333 A1 | 5/2019 | Borthakur |
| 2019/0166319 A1* | 5/2019 | Sato ...................... H10F 39/812 |
| 2021/0193727 A1* | 6/2021 | Asatsuma .............. H04N 25/70 |

FOREIGN PATENT DOCUMENTS

| | | |
|---|---|---|
| WO | 2017169754 A1 | 10/2017 |
| WO | 2017043343 A1 | 7/2018 |

* cited by examiner

SEMICONDUCTOR APPARATUS AND DEVICE

CROSS-REFERENCE TO RELATED APPLICATIONS

This application is a Continuation of International Patent Application No. PCT/JP2020/043250, filed Nov. 19, 2020, which claims the benefit of Japanese Patent Application No. 2019-212300, filed Nov. 25, 2019, both of which are hereby incorporated by reference herein in their entirety.

BACKGROUND OF THE INVENTION

Field of the Invention

The present invention relates to a semiconductor apparatus.

Background Art

There is a technique for performing dynamic range expansion, focal point detection, distance measurement, and depth information acquisition based on electric charges generated in each of a plurality of photodiodes disposed in one pixel.

Patent Literature 1 discloses an image sensor including pixels each having a plurality of nested photodiodes (sub pixels), and a pixel circuit for the image sensor (FIG. 3).

Non-patent Literature 1 discloses a circuit (FIG. 1) similar to the pixel circuit according to Patent Literature 1, and discloses that the in-pixel circuits and a low gain capacitor are placed above a part of a deep diode.

CITATION LIST

Patent Literature

PTL 1: United States Patent Application Publication No. 2019/0131333
NPTL 1: "Pixel with nested photo diodes and 120 dB single exposure dynamic range", Manuel Innocent, 2019 International Image Sensor Workshop P13

Non-patent Literature 1 does not provide sufficient considerations on the arrangements of circuit components. Depending on the arrangements of circuit components, light incident to a pixel and electric charges generated by light unstabilizes circuit operations, and degrades the accuracy of a signal output from the pixel. Therefore, there has been an issue of the degradation of the pixel characteristics.

SUMMARY OF THE INVENTION

The present invention is directed to providing a technique that is advantageous in obtaining preferable pixel characteristics in a semiconductor apparatus.

As a method for solving the above-described problem, there is provided a semiconductor apparatus including a semiconductor layer having a plurality of pixels arranged in a matrix form, and having a front surface and a back surface. One of the plurality of pixels includes a plurality of photodiodes disposed in the semiconductor layer. Nine sections, obtained by dividing a light receiving region of the one pixel on the back surface of the semiconductor layer into three equal sections in each of row and column directions, include a first section and eight sections (including a second section, a third section, a fourth section, a fifth section, a sixth section, a seventh section, an eighth section, and a ninth section). The first section is positioned between the second and third sections and between the fourth and fifth sections. A first photoelectric conversion member included in a certain photodiode of the plurality of photodiodes is disposed at a position overlapping with the first section in a direction perpendicular to the back surface. A second photoelectric conversion member included in a photodiode different from the certain photodiode is disposed at a position overlapping with the second section in the direction perpendicular to the back surface. A third photoelectric conversion member included in a photodiode different from the certain photodiode is disposed at a position overlapping with the third section in the direction perpendicular to the back surface. A plurality of electrodes each forming a Metal-Insulator-Semiconductor (MIS) structure together with the semiconductor layer is disposed on the front surface of the semiconductor layer. At least one of the plurality of electrodes overlaps with at least one of the eight sections in the direction perpendicular to the back surface.

Further features of the present invention will become apparent from the following description of exemplary embodiments with reference to the attached drawings.

DESCRIPTION OF THE EMBODIMENTS

Figure 1A:
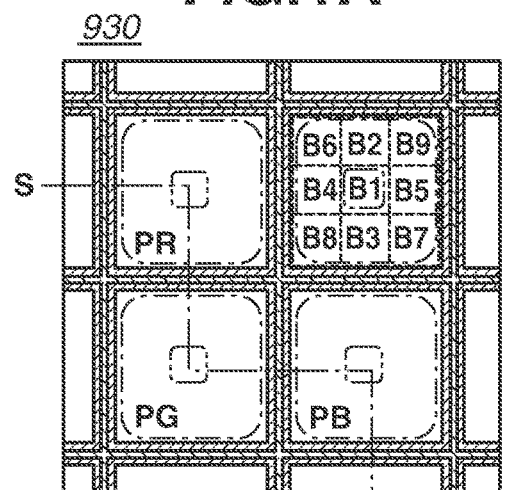
FIG. 1A is a schematic view illustrating an example of a semiconductor apparatus.

Exemplary embodiments of the present invention will be described below with reference to the accompanying drawings. In the following descriptions and drawings, components common to a plurality of drawings are assigned common reference numerals. Therefore, common components will be described below with cross reference to the plurality of drawings, and descriptions of components assigned common reference numerals will be omitted as appropriate. Although elements assigned common names can be distinctively represented by reference numerals supplied to these elements, the elements can also be represented by preceding ordinal numbers, for example, a first element, a second element, and an N-th element.

Figure 1B:
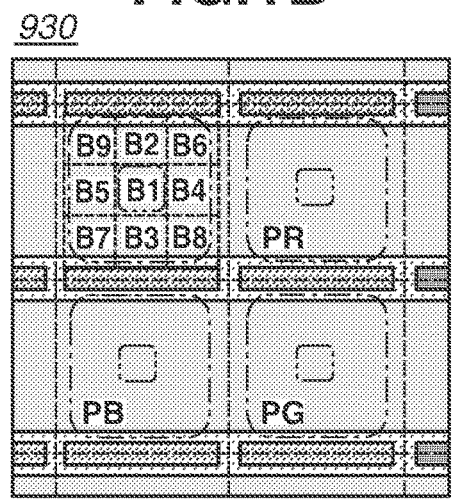
FIG. 1B is a schematic view illustrating an example of a semiconductor apparatus.
Figure 1C:
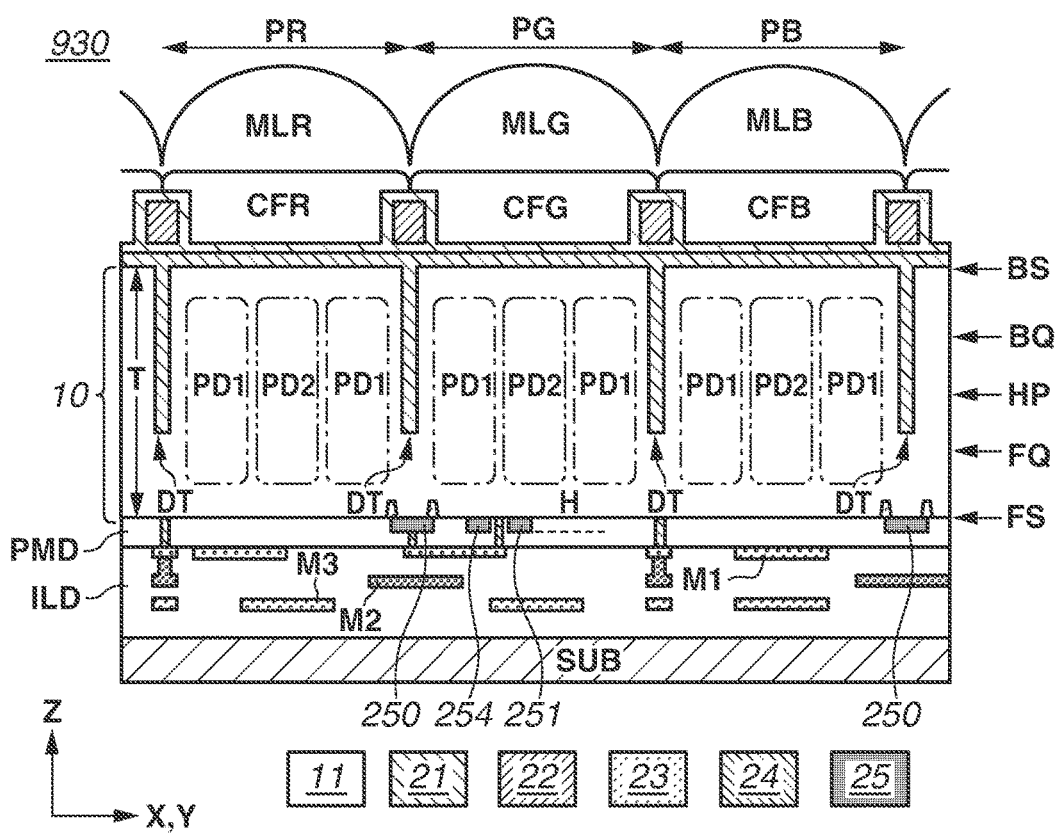
FIG. 1C is a schematic view illustrating an example of a semiconductor apparatus.

FIGS. 1A and 1B are plan views illustrating a region mainly including four pixels (in 2 rows by 2 columns) out of a plurality of pixels arranged in a matrix form included in a semiconductor apparatus 930. FIG. 1C is a cross-sectional view illustrating the semiconductor apparatus 930 taken along the S-S' line in FIG. 1A.

As illustrated in FIG. 1C, the semiconductor apparatus 930 includes a semiconductor layer 10 having a front surface FS and a back surface BS. The back surface BS is the surface opposite to the front surface FS, and the back surface BS and the front surface FS are approximately parallel to each other. FIG. 1A is a plan view illustrating the back surface BS, and FIG. 1B is a plan view illustrating the front surface FS. The semiconductor apparatus 930 is a backside-illumination type semiconductor apparatus having a light receiving region 11 on the back surface BS. The direction parallel to the front surface FS and/or the back surface BS is referred to as the X and Y directions, and the direction perpendicular to the front surface FS and/or the back surface BS is referred to as the Z direction. The X direction is one of the row and column directions, and the Y direction is the other of the row and column directions. In this example, the X direction is the row direction, and the Y direction is the column direction. However, the X direction may be the column direction, and the Y direction may be the row direction. A pixel row includes pixels arranged in the row direction (X direction), and a pixel column includes pixels arranged in the column direction (Y direction). A plurality of pixel rows is arranged in the Y direction (column direction), and a plurality of pixel columns is arranged in the X direction (row direction). Signals of a plurality of pixels are read by scanning the pixel rows in the column direction, and the read signals may be processed by a plurality of column circuits corresponding to the pixel columns.

The X and Y directions intersect (typically, perpendicularly intersect) with each other. In this example, the X, Y, and Z directions intersect with each other. When pixels are arranged in a quadrate lattice form, the row and column directions perpendicularly intersect with each other. However, the row and column directions may not need to perpendicularly intersect with each other. A pixel array is not limited to a quadrate lattice but may be an orthorhombic lattice, lozenge lattice, central rectangle lattice, isosceles triangular lattice, hexagonal lattice, equilateral triangular lattice, rectangular lattice, primitive rectangular lattice, parallel lattice, or distorted oblique lattice.

In the following descriptions, a case where "A overlaps with B" in the Z direction means that A and B overlap with each other in the Z direction. The thickness T of the semiconductor layer 10 refers to a dimension of the semiconductor layer 10 in the Z direction and is defined as the distance between the front surface FS and the back surface BS. For example, the thickness T of the semiconductor layer 10 is 1 to 10 μm, typically 2 to 5 μm. A virtual plane that is parallel to the front surface FS and positioned at a distance T/4 from the front surface FS of the semiconductor layer 10 is referred to as a plane FQ. A virtual plane that is parallel to the back surface BS and positioned at a distance T/4 from the back surface BS of the semiconductor layer 10 is referred to as a plane BQ. The distance between the plane FQ and the back surface BS is T×¾, and the distance between the plane BQ and the front surface FS is T×¾. A virtual plane that is parallel to the front surface FS and the back surface BS and positioned between the planes BQ and FQ is referred to as a plane HP. The typical position of the plane HP is equidistant from the front surface FS and the back surface BS. More specifically, the typical distance between the plane HP and the front surface FS is T/2, and the typical distance between the typical plane HP and the back surface BS is T/2.

At least one pixel (each of a pixel PR, a pixel PG, and a pixel PB in this example) of a plurality of pixels includes a plurality of photodiodes PD1 and PD2 disposed in the semiconductor layer 10. The photodiodes PD1 and PD2 may have a nested structure. More specifically, the photodiode PD2 may surround the photodiode PD1. Although, in this case, one pixel includes two photodiodes, one pixel may include three or more photodiodes. The nested structure may be such that two or more photodiodes surround one photodiode PD1. In this case, one photodiode PD1 may be sandwiched by two photodiodes.

The light receiving region 11 of one pixel, the pixel PG as an example, will be described below. The light receiving region 11 of one pixel on the back surface BS of the semiconductor layer 10 is divided into three equal sections in each of the row (X) and column (Y) directions to obtain nine sections B1 to B9. The nine sections are roughly grouped into the section B1, and the other eight sections B2, B3, B4, B5, B6, B7, B8 and B9. The section B1 is positioned between the sections B2 and B3 and between the sections B4 and B5. The section B1 is also positioned between the sections B6 and B7 and between the sections B8 and B9. In this example, the section B2 is positioned between the sections B6 and B9, the section B3 is positioned between the sections B8 and B7, the section B4 is positioned between the sections B6 and B8, and the section B5 is positioned between the sections B7 and B9. In this manner, the section B1 positioned at the center of the nine sections B1 to B9 can be referred to as a central section. The eight sections B2 to B9 positioned around the section B1 can be referred to as peripheral sections. Since the section B1 is surrounded by the eight sections B2 to B9, the eight sections B2 to B9 can also be referred to as outer sections, and the section B1 can also be referred to as an inner section.

Each of the photodiodes PD1 and PD2 has a photoelectric conversion member. Referring to FIG. 1C, the range where a photoelectric conversion member forming the photodiode PD1 may exist is surrounded by a dot-dash line, and the range where a photoelectric conversion member forming the photodiode PD2 may exist is surrounded by a chain double dash line. FIG. 1A illustrates the photoelectric conversion members existing on the plane HP in FIG. 1C so as to overlap with the back surface BS. FIG. 1B illustrates the photoelectric conversion members existing on the plane HP in FIG. 1C so as to overlap with the front surface FS. When a chain double dash line surrounds a dot-dash line in FIGS. 1A and 1B, a photoelectric conversion member forming the photodiode PD2 may exist in the portion between the dot-dash and the chain double dash lines.

In the following descriptions, the photoelectric conversion members of the photodiodes PD1 and PD2 are distinguished by the position within a pixel. The photoelectric conversion member included in the photodiode PD2 of the plurality of photodiodes is disposed at the position overlapping with the section B1 in the Z direction perpendicular to the back surface BS. The photoelectric conversion member included in a photodiode (photodiode PD1) different from the photodiode PD2 of the plurality of photodiodes is disposed at the position overlapping with the section B2 in the Z direction perpendicular to the back surface BS. The photoelectric conversion member included in a photodiode (photodiode PD1) different from the photodiode PD2 of the plurality of photodiodes is disposed at the position overlapping with the section B3 in the Z direction perpendicular to the back surface BS. Likewise, the photoelectric conversion member included in a photodiode (photodiode PD1) different from the photodiode PD2 of the plurality of photodiodes is disposed at the position overlapping with the sections B4 to B9 in the Z direction perpendicular to the back surface BS. In this way, it is important that at least the photoelectric conversion member corresponding to a photodiode (photodiode PD1) different from the photodiode PD2 is disposed in the sections on both sides of the section B1 corresponding to the photoelectric conversion member of the photodiode PD2. In this example, each of the plurality of photoelectric conversion members overlapping with the sections B2 to B9 as the outer sections is included in a single photodiode PD1. More specifically, the photodiode PD2 includes the photoelectric conversion member overlapping with the section B1, and the photodiode PD1 includes the photoelectric conversion member overlapping with the section B2 and the photoelectric conversion member overlapping with the section B3. However, the photoelectric conversion members of one part of the plurality of photoelectric conversion members overlapping with the sections B2 to B9 as the outer sections and the photoelectric conversion members of the other part thereof may be included in different photodiodes. For example, the photodiode including photoelectric conversion members overlapping with the sections B6, B2, and B9 may be different from the photodiode including photoelectric conversion members overlapping with the B8, B3, and B7. A plurality of photoelectric conversion members included in different photodiodes may overlap with one section. For example, the photoelectric conversion member overlapping with a half of the section B5 on the section B9 side may be separated from the photoelectric conversion member overlapping with a half of the section B5 on the section B7 side.

On the front surface FS of the semiconductor layer 10, there is disposed a plurality of electrodes 25 forming a Metal-Insulator-Semiconductor (MIS) structure together with the semiconductor layer 10. An electrode 25 corresponds to Metal of the MIS structure and is typically made of polysilicon. However, the electrode 25 may be made of a metal or a metal compound such as silicide. The MIS structure can be used not only as the gate of a MIS-Field Effect Transistor (FET) but also as an MIS type capacitor. An electrode 25 forming the MIS type gate of a transistor can be referred to as a gate electrode, and the electrode 25 forming an MIS type capacitor can be referred to as a capacitor electrode. Types of transfers include a transfer transistor for transferring electric charges, a switching transistor for performing switching, and an amplifying transistor for performing amplification. The electrode 25 as the gate electrode of a transfer transistor is referred to as a transfer electrode. A part of the electrodes 25 can be used as a wiring or resistor. Insulator of the MIS structure is, for example, a silicon oxide film having a thickness of about 1 to 10 nm, and may be a metal oxide film such as a hafnium oxide film. The silicon oxide film as Insulator of the MIS structure may contain an amount of nitrogen (for example, 10 atomic % or less) smaller than that of oxygen and silicon. An insulator forming the MIS type gate of a transistor is referred to as a gate insulation film.

The front face FS of the semiconductor layer 10 includes element regions 12 and 13. The element regions 12 and 13 include not only a semiconductor region having an MIS structure but also a source, drain, and well. The element regions 12 and 13 may also be referred to as active regions. Semiconductor of the MIS structure is formed of the semiconductor layer 10. An element separation portion 23 having an insulator separation structure is disposed on the semiconductor layer 10 on the side of the front surface FS. The element separation portion 23 is positioned between the element regions 12 and 13. The element separation portion 23 defines the element regions 12 and 13. The insulator separation structure includes a Shallow-Trench-Isolation (STI) structure and a Local-Oxidation-Of-Silicon (LOCOS) structure, and the STI structure is preferable. The depth of the element separation portion 23 having the STI structure is, for example, equal to or larger than ½ times and equal to or less than 10 times, preferably 5 times, or more preferably 5 times the thickness H of the electrodes 25. The depth of the element separation portion 23 is, for example, 50 to 500 nm. The thickness H of the electrodes 25 is, for example, 50 to 250 nm. The element separation portion that has a PN junction separation structure can be disposed in the semiconductor layer 10. Element separation may be performed only by the element separation portion having the PN junction separation structure, without disposing the element separation portion 23 having the insulator separation structure.

At least one of the plurality of electrodes 25 overlaps with at least one of the eight sections B2 to B9 in the Z direction perpendicular to the back surface BS. Disposing the electrodes 25 so as to overlap with at least one of the eight sections B2 to B9 in this way enables obtaining preferable pixel characteristics.

If all of the electrodes 25 corresponding to one pixel are disposed to overlap with the section B1, the operation of the MIS structure including the electrodes 25 is unstabilized by incident light and electric charges generated by incident light. The portion overlapping with the section B1 is more likely to be affected by light and electric charges than the portions overlapping with the sections B2 to B9 for the following reason. Firstly, since the section B1 is positioned at the center of a pixel, the section B1 is subjected to a larger amount of incident light than the sections B2 to B9. If the light incident to the peripheral sections B2 to B9 is diffused, the diffused light easily enters the portion overlapping with the section B1. Sine the photodiode PD2 overlapping with the section B1 is small in volume, electric charges of the photodiode PD2 are likely to overflow from the photodiode PD2. In addition, electric charges that overflowed from the photoelectric conversion member overlapping with the sections B2 to B9 are more likely to flow into the portion overlapping with the section B1 in the same pixel than in the adjacent pixels.

If all of the electrodes 25 corresponding to one pixel are disposed to overlap with none of the nine sections B1 to B9, the gap between the light receiving regions of a plurality of pixels increases. Maintaining the number of pixels makes it necessary to reduce the area of the light receiving regions, resulting in a decrease in the light utilization efficiency. Maintaining the area of the light receiving regions results in a decrease in the number of pixels and an increase in the apparatus size.

Accordingly, by disposing at least a part of the plurality of electrode 25 so as to overlap with the sections B2 to B9, the electrode 25 overlapping with the section B1 can be eliminated or reduced, and the regions overlapping with the sections B2 to B9 can be effectively utilized. This enables obtaining preferable pixel characteristics. For example, referring to FIG. 1C, an electrode 254 as one of the electrodes 25 overlaps with any one of the sections B2 to B9 (e.g., the section B4).

At least one of the plurality of electrodes 25 may overlap with the section B1 in the Z direction perpendicular to the back surface BS. The electrode 25 overlapping with the section B1 may be an element especially closely related with the photodiode PD2 out of the plurality of electrodes 25. For example, it is preferable that the gate electrode of a transistor having the photodiode PD2 as the source overlaps with the section B1. For example, referring to FIG. 1C, an electrode 251 as one of the electrodes 25 overlaps with the section B1.

At least one of the plurality of electrodes 25 associated with one pixel may be disposed in a region (non-overlapping region) not overlapping with the light receiving region 11 of one pixel on the front surface FS of the semiconductor layer 10 in the direction perpendicular to the front surface FS. The non-overlapping region not overlapping with the light receiving region 11 of one pixel may be the region overlapping with the light receiving region 11 of other pixels or may be a light shielded region between pixels. For example, referring to FIG. 1C, an electrode 250 as one of the electrodes 25 overlaps with none of the sections B1 to B9. For example, the electrode 250 is the gate electrode of an amplifying transistor that generates a signal based on electric charges of the photodiode PD1 and a signal based on electric charges of the photodiode PD2.

At least one of the plurality of electrodes 25 may overlap with at least one of the eight sections B2 to B9 in the Z direction perpendicular to the back surface BS, and overlap with the element separation portion 23 having the insulator separation structure in the direction Z perpendicular to the front surface FS. The electrodes 25 overlapping with the element separation portion 23 may be the gate electrode of a transistor with which the channel width desirably needs to be accurately controlled by the element separation portion 23. A transistor with which the channel width needs to be accurately controlled is, for example, an amplification transistor that amplifies a signal. For example, referring to FIG. 1C, the electrode 250 as one of the electrodes 25 overlaps with the element separation portion 23.

At least one of the plurality of electrodes 25 does not need to overlap with the element separation portion 23 in the Z direction perpendicular to the back surface BS. The element separation portion 23 may become a noise source. Therefore, the electrodes 25 not overlapping with the element separation portion 23 may be the gate electrode of a transistor with which mixing of electric charges that may be noise desirably needs to be prevented. The transistor with which mixing of electric charges that can be noise desirably needs to be prevented is, for example, a transfer transistor that transfers electric charges. Accordingly, with a transfer transistor, it is preferable to use an element separation portion having the PN junction separation structure without using the element separation portion 23 having the insulator separation structure. For example, referring to FIG. 1C, electrodes 251 and 252 as a part of the electrodes 25 do not overlap with the element separation portion 23.

On the front surface FS, there is disposed a plurality of contact plugs 24 in contact with the semiconductor layer 10 or the electrodes 25. The contact plugs 24 are disposed in contact holes disposed in an insulation film PMD. A contact plug 24 may include a conductive member made of a metal such as tungsten, and a barrier metal member disposed between the conductive member and the insulation film PMD and made of a metal such as titanium and a metal compound such as titanium nitride. The barrier metal member of the contact plug 24 may come in contact with the insulation film PMD and the semiconductor layer 10. One part of the plurality of contact plugs 24 can be disposed to overlap with the section B1 as the inner section. The other part of the plurality of contact plugs 24 can be disposed to overlap with at least any one of the eight sections B2 to B9 as the outer sections. The other part of the plurality of contact plugs 24 can be disposed to overlap with the light shielded region.

On the insulation film PMD, a wiring layer M1 connecting to the contact plugs 24 is disposed. The wiring layer M1 may be, for example, a copper wiring layer having a single damascene structure. Above the wiring layer M1, a wiring layer M2 connecting to the wiring layer M1 through a via plug is disposed. Above the wiring layer M2, a wiring layer M3 connecting to the wiring layer M2 through a via plug is disposed. The wiring layers M2 and M3 may be copper wiring layers having a dual damascene structure. The wiring layers M1, M2, and M3 may be aluminum wiring layers. An interlayer insulation film ILD is disposed between the wiring layer M1, M2, and M3.

The semiconductor apparatus 930 may be provided with a substrate SUB. The substrate SUB is bonded to a multilayer wiring structure including the wiring layers M1, M2, and M3 and the interlayer insulation film ILD. The substrate SUB may be a simple supporting substrate having no active elements such as transistors or an integrated circuit substrate including transistors that form an integrated circuit. If the substrate SUB is an integrated circuit substrate, any one of the wiring layers M1 to M3 and the substrate SUB are electrically connected with each other by using methods such as bumps, metallic bonding between the wiring layers, and through electrodes.

A pixel PR at the upper left portion in FIG. 1A is a red pixel for photoelectrically converting red light, and includes a red color filter CFR, as illustrated in FIG. 1C. A pixel PG at the lower left portion and a pixel at the upper right portion in FIG. 1A are green pixels for photoelectrically converting green light, and include a green color filter CFG, as illustrated in FIG. 1C. The pixel PB at the bottom right portion in FIG. 1A is a blue pixel for photoelectrically converting blue light, and includes a blue color filter CFB, as illustrated in FIG. 1C. Accordingly, the semiconductor apparatus 930 may be provided with a color filter array including color filters CFR, CFG, and CFB arranged in a Bayer array on the back surface BS of the semiconductor layer 10. Each of the color filters CFR, CFG, and CFB overlaps with at least four sections in the Z direction perpendicular to the back surface BS out of the nine sections B1 to B9 in the light receiving region 11 of the pixels with which these color filters are associated. This example illustrates the central part of the pixel region where each of the color filters CFR, CFG, and CFB overlaps with all of the nine sections B1 to B9. To enable the light receiving region 11 to receive oblique incident light at the periphery of the pixel region, each of the color filters CFR, CFG, and CFB may be deviated from the center of the light receiving region 11. In such a case, for example, the color filters CFR, CFG, and CFB may overlap only with four sections B1, B3, B5, and B7 but not overlap with the sections B2, B4, B6, B8, and B9. It is preferable that each of the color filters CFR, CFG, and CFB overlaps with at least the section B1 out of the light receiving region 11 of the pixels with which these color filters are associated. The color filter array enables providing the semiconductor apparatus 930 capable of acquiring color images. However, when acquiring monochrome images, the color filter array can be omitted.

The semiconductor apparatus 930 may include a microlens array formed of a plurality of microlenses MLR, MLG, and MLB two-dimensionally arranged through the color filter array above the back surface BS of the semiconductor layer 10. The microlens MLR is associated with pixel PR, the microlens MLG is associated with pixel PG, and the microlens MLB is associated with pixel PB. Each of the microlenses MLR, MLG, and MLB overlaps with at least the four sections in the Z direction perpendicular to the back surface BS out of the nine sections B1 to B9 of the light receiving region 11 of the pixels with which these microlenses are associated. This example illustrates the central part of the pixel region where each of the microlenses MLR, MLG, and MLB overlaps with all of the nine sections B1 to B9. To enable the light receiving region 11 to receive oblique incident light at the periphery of the pixel region, each of the microlenses MLR, MLG, and MLB may be deviated from the center of the light receiving region 11. In such a case, for example, the microlenses MLR, MLG, and MLB may overlap only with the four sections B1, B3, B5, and B7 but not overlap with the sections B2, B4, B6, B8, and B9. It is preferable that each of the microlenses MLR, MLG, and MLB overlaps with at least the section B1 out of the light receiving region 11 of the pixels with which these microlenses are associated. If the light receiving region 11 of each pixel is wide enough, the microlens array can be omitted.

The semiconductor apparatus 930 may include a light shielded portion 22 disposed on the back surface BS of the semiconductor layer 10. As illustrated in FIG. 1A, the light shaded portion 22 may have a lattice shape to define the light receiving region 11 on the back surface BS for each of the pixels PR, PG, and PB. Of the back surface BS, the region overlapping with the light shielded portion 22 is a light shielded region positioned outside the light receiving region 11. In this example, a light shielded region is positioned between the light receiving region 11 of the pixel PG and the light receiving region 11 of the pixel PR adjacent to the pixel PG, and a light shielded region is positioned between the light receiving region 11 of the pixel PG and the light receiving region 11 of the pixel PB adjacent to the pixel PG. The light shielded portion 22 reduces the optical crosstalk (or color mixture) on the back surface BS. Although, in this example, the light shielded portion 22 is disposed between the color filters CFR, CFG, and CFB, the light shielded portion 22 may be disposed between the color filter array and the semiconductor layer 10. The light shielded portion 22 can be omitted. If the light shielded portion 22 is omitted, for example, the light receiving region 11 of the pixel PG continues to the light receiving region 11 of the pixel PR adjacent to the pixel PG, and also continues to the light receiving region 11 of the pixel PB adjacent to the pixel PG on the back surface BS.

Under the light shielded portion 22, the semiconductor layer 10 is provided with grooves DT having continuous side faces on the back surface BS. The side faces of the grooves DT are not included in the light receiving region 11. The grooves DT reduce the optical crosstalk and electrical crosstalk in the semiconductor layer 10. It is preferable that the depth of the grooves DT from the back surface BS is at least a quarter of the thickness T of the semiconductor layer 100. More specifically, it is preferable that the grooves DT pass through the plane BQ. It is preferable that the depth of the grooves DT from the back surface BS is at least a half of the thickness T of the semiconductor layer 100. More specifically, it is preferable that the grooves DT pass through the plane HP. The grooves DT may overlap with the element region 12. The grooves DT may also overlap with the element region 13. The depth of the grooves DT from the back surface BS may be at least ¾ times the thickness T of the semiconductor layer 100. The grooves DT may penetrate through the semiconductor layer 100. However, it is preferable that, in reducing damage and noise that may be applied to the elements (transistors) disposed in the element regions 12 and 13 by the grooves DT, the depth of the grooves DT from the back surface BS is less than ¾ times the thickness T of the semiconductor layer 100. More specifically, it is preferable that the grooves DT do not pass through the plane FQ and that the plane FQ is positioned between the bottom of the grooves DT and the front surface FS. This configuration enables reducing the influence of the grooves DT on the elements disposed on the front surface FS. The grooves DT can be omitted. If the grooves DT are omitted, the back surface BS continues over a plurality of pixels. On the back surface BS, a dielectric film 21 is disposed to cover the back surface BS. In this example, the dielectric film 21 expands in the grooves DT and covers the side surfaces of the grooves DT. Instead of providing the dielectric film 21 in the grooves DT, the dielectric film 21 may be disposed to block the entries of the grooves DT. In this case, a cavity may exist in the grooves DT. The dielectric film 21 may be a single-layer film or a multilayered film. Layers included in the dielectric film 21 may be silicon compound layers such as silicon oxide layers and silicon nitride layers, and/or metal oxide layers such as aluminum oxide layers, hafnium oxide layers, tantalum oxide layers, and titanium oxide layers. Aluminum oxide layers and hafnium oxide layers are useful in fixing noise charges generated in the vicinity of the back surface BS to the vicinity of the back surface BS. Tantalum oxide layers and titanium oxide layers are useful in preventing light reflection by the back surface BS. Although the configuration on the back surface BS is illustrated, the present invention is not limited thereto.

Figure 2:
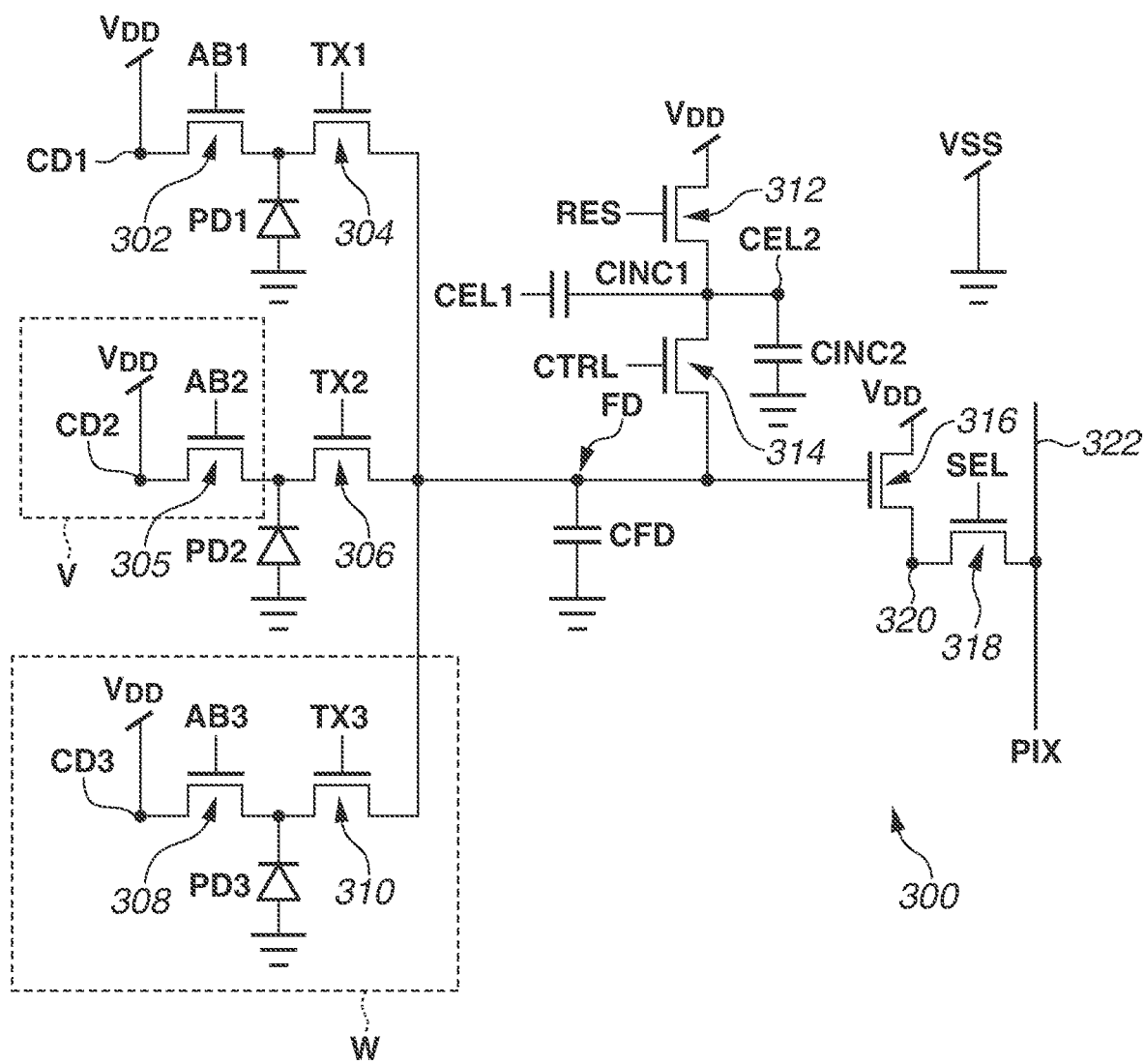
FIG. 2 is a schematic view illustrating an example of a semiconductor apparatus.

FIG. 2 illustrates a circuit diagram as an example of a pixel circuit 300 that reads a signal from one pixel PG. One pixel PG may include a plurality of photodiodes PD1, PD2, and PD3. The pixel circuit 300 is preferred when the photodiodes PD1 and PD3 have a higher sensitivity than the photodiode PD2. However, the photodiodes PD1 and PD3 may have a lower sensitivity than the photodiode PD2. A transfer gate 304 is connected to the photodiode PD1, a transfer gate 306 is connected to the photodiode PD2, and a transfer gate 310 is connected to the photodiode PD3. The transfer gate 304 includes a transfer electrode TX1 for transferring the electric charges generated in the photoelectric conversion member of the photodiode PD1 to an electric charge storage portion FD disposed in the semiconductor layer 10. The transfer gate 306 includes a transfer electrode TX2 for transferring the electric charges generated in the photoelectric conversion member of the photodiode PD2 to the electric charge storage portion FD disposed in the semiconductor layer 10. The transfer gate 310 includes a transfer electrode TX3 for transferring the electric charges generated in the photoelectric conversion member of the photodiode PD3 to the electric charge storage portion FD disposed in the semiconductor layer 10. The plurality of electrodes 25 described above with reference to FIG. 1C includes these transfer electrodes TX1, TX2, and TX3. For example, the electrode 254 described above with reference to FIG. 1C is, for example, the transfer electrode TX1, and the electrode 251 described above with reference to FIG. 1C is, for example, the transfer electrode TX2. The pixel circuit 300 can be thought to include three different transistors that have the transfer gates 304, 306, and 310 as the gate, the photodiodes PD1, PD2, and PD3 as the source, and the electric charge storage portion FD as the drain. The semiconductor regions (channel regions) of the transfer gates 304, 306, and 310 and/or the electric charge storage portion FD may be disposed in the element region 12 in FIG. 1B. The transfer electrodes TX1, TX2, and TX3 may be disposed not to overlap with the element separation portion 23. This is advantageous in preventing the signal-to-noise (S/N) ratio degradation occurring when noise charges that may be generated in the vicinity of the element separation portions 23 of the semiconductor layer 10 enter the electric charge storage portion FD.

A transfer gate 302 is connected to the photodiode PD1, and a transfer gate 308 is connected to the photodiode PD3. The transfer gate 302 includes a transfer electrode AB1 for transferring the electric charges generated in the photoelectric conversion member of the photodiode PD1 to an electric charge discharge portion CD1 disposed in the semiconductor layer 10. The transfer gate 308 includes a transfer electrode AB3 for transferring the electric charges generated in the photoelectric conversion member of the photodiode PD3 to an electric charge discharge portion CD3 disposed in the semiconductor layer 10. The electric charge discharge portions CD1 and CD3 are supplied with a power potential VDD as a fixed potential. The pixel circuit 300 can be thought to include two different transistors that have the transfer gates 302 and 308 as the gate, the photodiodes PD1 and PD3 as the source, and the electric charge discharge portions CD1 and CD3 as the drain. The semiconductor regions (channel regions) of the transfer gates 302 and 308 and/or the electric charge discharge portions CD1 and CD3 are disposed in the element region 12 in FIG. 1B.

The transfer gate 305 is connected to the photodiode PD2. The transfer gate 305 includes a transfer electrode AB2 for transferring the electric charges generated in the photoelectric conversion member of the photodiode PD2 to an electric charge discharge portion CD2 disposed in the semiconductor layer 10. The pixel circuit 300 can be thought to include one transistor that has the transfer gate 305 as the gate, the photodiode PD2 as the source, and the electric charge discharge portion CD2 as the drain. The semiconductor region (channel region) of the transfer gate 305 and the electric charge discharge portion CD2 are disposed in the element region 12 in FIG. 1B.

The electric charge storage portion FD is a semiconductor region having a conductivity type (for example, an n-type region where electrons are majority carriers) in which signal charges are majority carriers. The electric charge storage portion FD forms a PN junction with a semiconductor region of a conductivity type (e.g., p-type) in which signal charges are minority carriers, thus forming a capacitor CFD of the PN junction type. The electric charge storage portion FD is connected to a gate electrode SF of an amplifying transistor 316. A node including the electric charge storage portion FD and the gate electrode SF of the amplifying transistor 316 is referred to as a detection node. Therefore, the electric charge storage portion FD can also be referred to as an electric charge detection portion. The potential of the detection node is a floating potential, and is determined based on electric charges of the detection node and the capacitance of the detection node. The amplifying transistor 316 forms a source follower circuit, and the drain of the amplifying transistor 316 is supplied with the power potential VDD as a fixed potential. A signal output line 322 is connected to the source of the amplifying transistor 316 via a selection transistor 318 that performs switching, and a pixel signal PIX is output via the signal output line 322. The amplifying transistor 316 generates a signal based on electric charges of the photodiode PD1 and a signal based on electric charges of the photodiode PD2. The amplifying transistor 316 also generates a signal based on electric charges of the photodiode PD3. The ON/OFF state of the selection transistor 318 is controlled by the selection signal supplied to a gate electrode SEL of the selection transistor 318. The plurality of electrodes 25 described above with reference to FIG. 1C includes these gate electrodes SF and SEL. The semiconductor regions (channel region and source and drain regions) of the amplifying transistor 316 and/or the selection transistor 318 are disposed in the element region 13 in FIG. 1B. The gate electrode SF of the amplifying transistor 316 and the gate electrode SEL of the selection transistor 318 may overlap with the element separation portion 23 in FIGS. 1B and 1C. Therefore, the element separation portion 23 may be positioned between the electric charge storage portion FD and the semiconductor region of the amplifying transistor 316 and/or the selection transistor 318. The electrode 250 described above with reference to FIG. 1C is, for example, the gate electrode SF. Defining the channel width of the amplifying transistor 316 based on the element separation portion 23 is advantageous in reducing characteristic variations of the amplifying transistor 316.

A MIS type capacitor CINC1 and/or a MIS type capacitor CINC2 is connected to the electric charge storage portion FD and the gate electrode SF via a control transistor 314 that performs switching. One electrode of the MIS type capacitor CINC1 is referred to as a capacitor electrode CEL1. One electrode of the MIS type capacitor CINC2 is referred to as a capacitor electrode CEL2. The plurality of electrodes 25 described above with reference to FIG. 1C may include the capacitor electrodes CEL1 and CEL2 that form the MIS type capacitors CINC1 and CINC2, respectively, connected to the electric charge storage portion FD. The terminal of the control transistor 314 on the side of the electric charge storage portion FD is either one of the source and drain terminals. One terminal of the MIS type capacitor CINC1 is connected to the other of the source and drain terminals of the control transistor 314, and the other terminal of the capacitor CINC1 is the capacitor electrode CEL1. In the period during which the capacitor CINC1 is used, the capacitor electrode CEL1 may be supplied with a fixed potential. The potential supplied to the capacitor electrode CEL1 may be different between the period during which the capacitor CINC1 is used and the period during which it is not. The capacitor electrode CEL1 may be applied with the same potential as a gate electrode CTRL and/or a gate electrode RES. The capacitor electrode CEL1 may be integrally formed with the gate electrode CTRL or RES. The capacitor electrode CEL2 of the MIS type capacitor CINC2 is connected to the other of the source and drain terminals of the control transistor 314, and a fixed potential is supplied to the other terminal of the capacitor CINC2. Although, in this example, the other terminal of the capacitor CINC2 is supplied with a contact potential VSS, the other terminal may be supplied with the power potential VDD or supplied with an intermediate potential between the power potential VDD and the contact potential VSS. One of the source and drain terminals of a reset transistor 312 that performs switching is connected to the other of the source and drain terminals of the control transistor 314. The other of the source and drain terminals of the reset transistor 312 is supplied with the power potential VDD as a fixed potential. The plurality of electrodes 25 described above with reference to FIG. 1C includes the gate electrode CTRL of the control transistor 314 and the gate electrode RST of the reset transistor 312. The semiconductor region (channel region and source and drain regions) of the reset transistor 312 and/or the control transistor 314 may be disposed in the element region 13 in FIG. 1B. The gate electrode RES of the reset transistor 312 and the gate electrode CTRL of the control transistor 314 may overlap with the element separation portion 23 in FIGS. 1B and 1C. Therefore, the element separation portion 23 may be positioned between the electric charge storage portion FD and the semiconductor region of the reset transistor 312 and/or the control transistor 314.

When the control transistor 314 is turned ON, the capacitor CINC1 and/or the capacitor CINC2 is connected to the capacitor CFD via the control transistor 314. Accordingly, the capacitor CINC1 and/or the capacitor CINC2 is connected in parallel with the capacitor CFD. Then, the capacitance of the detection node increases to the sum of the capacitance of the capacitor CFD and the capacitance of the capacitor CINC1 and/or the capacitance of the capacitor CINC2. In other words, when the control transistor 314 is turned ON, the capacitance C of the detection node increases. When the capacitance C of the detection node increases, the displacement of the potential V of the detection node per electric charge amount Q of the detection node decreases, as is represented by $\Delta V=\Delta Q/C$. Thus, in a case of a large electric charge amount Q, the pixel signal PIX can be output with the reduced gain of the detection node. Example cases of a large electric charge amount Q include a case where a bright scene is captured and a case where the electric charges generated by the high-sensitivity photodiode PD1 are transferred through the transfer gate 304. On the other hand, in a case of a small electric charge amount Q, the capacitance C of the detection node decreases when the control transistor 314 is turned OFF. When the capacitance C of the detection node decreases, the displacement of the potential V of the detection node per electric charge amount Q of the detection node increases, as is represented by $\Delta V=\Delta Q/C$. Thus, in a case of a small electric charge amount Q, the pixel signal PIX can be output with the increased gain of the detection node. Example cases of a small electric charge amount Q include a case where a dark scene is captured and a case where the electric charges generated by the low-sensitivity photodiode PD2 are transferred through the transfer gate 306. A column circuit (not illustrated) is connected to the signal output line 322. The column circuit may include a Chip Shut Down (CSD) circuit, an analog amplifier, and/or an analog-to-digital (AD) converter. The signal level of the pixel signal PIX output based on electric charges of the photodiode PD1 and the signal level of the pixel signal PIX output based on electric charges of the photodiode PD2 may be combined (added). The addition of the signal levels may be performed in a state where the pixel signals PIX are analog signals or in a state where the pixel signals PIX as digital signals (after the AD conversion by the AD converter) are subjected to a logical operation. Combining the signal levels in this way enables expanding the dynamic range.

Since the capacitors CINC1 and CINC2 have equivalent functions in the pixel circuit 300, the pixel circuit 300 may be provide with either one of the capacitors CINC1 and CINC2.

Referring to FIG. 2, the components positioned at a portion V surrounded by the broken lines can be omitted. More specifically, in the pixel circuit 300, the transfer gate 305 and the electric charge discharge portion CD2 can be omitted.

Referring to FIG. 2, the component positioned at a portion W surrounded by the broken lines can be omitted. More specifically, in the pixel circuit 300, the photodiode PD3, the transfer gates 310 and 308, and the electric charge discharge portion CD3 can be omitted.

More specific first to ninth exemplary embodiments applicable to the exemplary embodiment described above with reference to FIGS. 1 and 2 will be described below. The semiconductor apparatus 930 (described below) may be a Complementary Metal Oxide Semiconductor (CMOS) image sensor. CMOS image sensors are currently increasing in the miniaturization and the number of pixels. This also applies to image sensor for in-vehicle camera applications. In particular, an image sensor for an in-vehicle camera having a plurality of photodiodes has a tendency that more pixel transistors are included than an ordinary CMOS image sensor. Accordingly, a technique for reducing the pixel area is important. The present exemplary embodiment has been devised in view of the above-described issues, and provides a pixel structure that prevents the increase in the pixel area in a CMOS image sensor including a plurality of nested type photodiodes.

First Exemplary Embodiment

Figure 3:
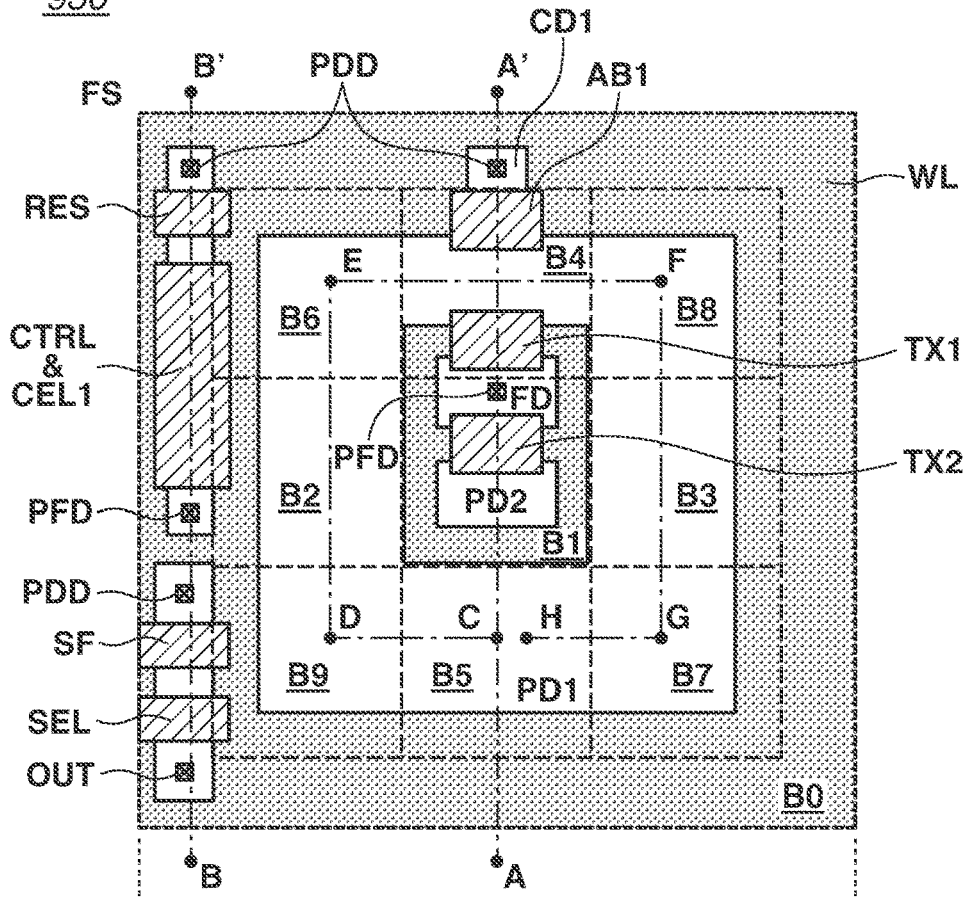
FIG. 3 is a schematic view illustrating an example of a semiconductor apparatus.
Figure 3:
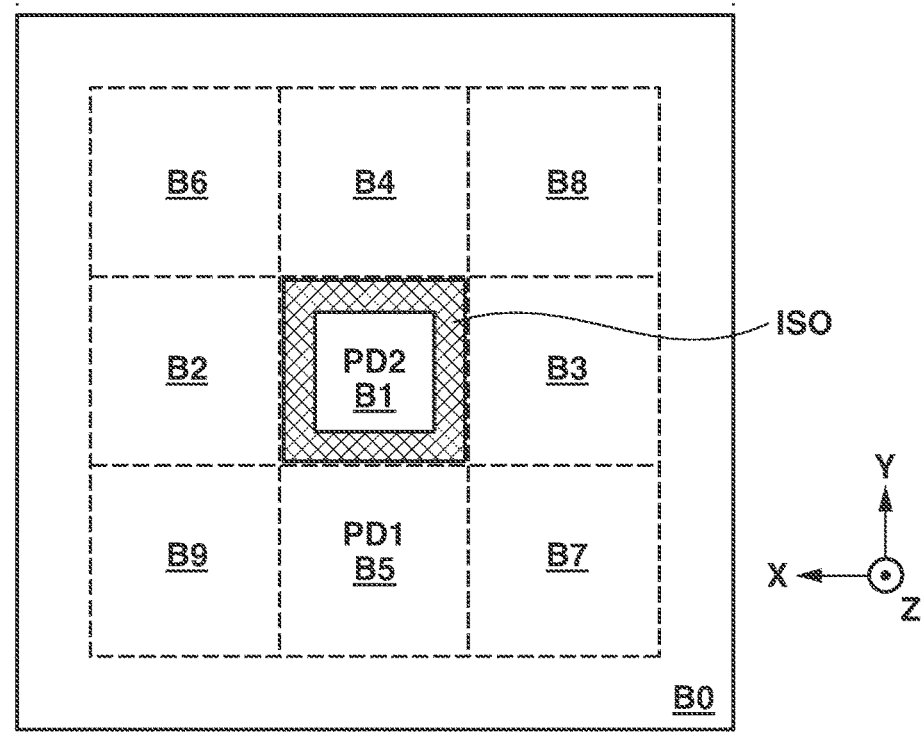

A first exemplary embodiment will be described below with reference to FIGS. 3, 4, and 5. According to the first exemplary embodiment, the semiconductor apparatus 930 does not need to include the components positioned at the portion V surrounded by the broken lines and the components positioned at the portion W surrounded by the broken lines in FIG. 2. FIG. 3 is a plan view illustrating a pixel according to the first exemplary embodiment. The upper part of FIG. 3 illustrates the components on the front surface FS side, and the lower part of FIG. 3 illustrates the components on the plane HP. On the front surface FS side and the plane HP side, the nine sections B1 to B9 in the light receiving region 11 on the back surface BS are illustrated in an overlapped way. On the front surface FS side and the plane HP side, a non-overlapping region B0 that does not overlap with the light receiving region 11 (sections B1 to B9) on the back surface BS out of the front surface FS is illustrated in an overlapped way. The non-overlapping region B0 overlaps with the light shielded region shaded by the light shielded portion 22 or the light receiving region of a pixel different from the pixel having the sections B1 to B9, on the back surface BS.

On the plane HP, the inner photodiode PD2 including the photodiode PD2 overlapping with the section B1 as the inner section is disposed at the center, and the outer photodiode PD1 is disposed to surround the inner photodiode PD2. The outer photodiode PD1 overlaps with the sections B2 to B9 as the outer sections. A separation region ISO is disposed between the inner photodiode PD2 and the outer photodiode PD1. The separation region ISO electrically and/or optically separates the inner photodiode PD2 and the outer photodiode PD1 from each other.

On the front surface FS side, on the other hand, the outer photodiode PD1 is disposed to surround the inner photodiode PD2 in a similar way. The inner photodiode PD2 is connected to the electric charge storage portion FD via a transfer gate including the transfer electrode TX2. The outer photodiode PD1 is connected to the electric charge storage portion FD via a transfer gate including the transfer electrode TX1. To prevent blooming, the outer photodiode PD1 is connected to the electric charge discharge portion CD1 via the transfer gate 302 including the transfer electrode AB1. A contact plug PDD for supplying the power potential VDD is connected to the electric charge discharge portion CD1. One end of the reset transistor 312 including the gate electrode RES is connected to a contact plug PDD for supplying the power potential VDD. The other end of the reset transistor 312 is shared with one end of the control transistor 314. The other end of the control transistor 314 is connected to the electric charge storage portion FD via a contact plug PFD and a wiring (not illustrated). The gate electrode SF of the amplifying transistor 316 is also connected to the electric charge storage portion FD. The drain of the amplifying transistor 316 is connected to a contact plug PDD for supplying the power potential VDD, and the source of the amplifying transistor 316 is connected to one end of the selection transistor 318 having the gate electrode SEL. The other end of the selection transistor 318 is connected to a contact plug OUT for output, and the contact plug OUT is connected to the signal output line 322.

The outer photodiode PD1 and the inner photodiode PD2 have different light sensitivities, i.e., the outer photodiode PD1 has a higher light sensitivity than the inner photodiode PD2 in the present exemplary embodiment. This is because the area and/or volume of the outer photodiode PD1 is made larger than the area and/or volume of the inner photodiode PD2. This configuration is also implemented by optimizing the arrangements and shapes of the microlens array and the color filter array to guide a larger light quantity to the outer photodiode PD1 than to the inner photodiode PD2. Signal reading in a wide dynamic range is implemented by the combination of the difference in sensitivity between the outer photodiode PD1 and the inner photodiode PD2 with the increase and decrease in the gain through the control of the control transistor 314.

Although, in FIG. 3, the photodiodes have a polygon-shape, they may have a different shape such as a circle shape or a doughnut shape. The sizes and orientations of pixel transistors, the arrangements and mutual positional relations in a unit pixel, and the way of sharing the source and drain terminals are to be considered as examples, and are not limited thereto.

As understood from FIG. 3, the transfer electrode TX2 overlaps with the section B2 in the Z direction perpendicular to the back surface BS. The transfer electrode TX1 overlaps with at least one of the eight sections B2 to B9 in the Z direction perpendicular to the back surface BS. In this example, the transfer electrode TX1 overlaps with the section B4. The transfer electrode AB1 overlaps with at least one of the eight sections B2 to B9 in the Z direction perpendicular to the back surface BS. In this example, the transfer electrode AB1 overlaps with the section B4. In this way, both the transfer electrode TX1 and AB1 overlap with at least the same section (section B4 in this example) of the eight sections B2 to B9. This improves the efficiency of charge transfer from the photodiode PD1 to the electric charge storage portion FD by the transfer electrode TX1, and the efficiency of charge transfer from the photodiode PD1 to the electric charge discharge portion CD1 by the transfer electrode AB1. The contact plug PFD connected to the electric charge storage portion FD overlaps with the section B1 in the Z direction perpendicular to the back surface BS. The contact plug PFD connected to an electric charge storage portion FD is positioned between the transfer electrodes TX1 and TX2. This improves the efficiency of charge transfer from the photodiode PD1 to the electric charge storage portion FD by the transfer electrode TX1, and the efficiency of charge transfer from the photodiode PD2 to the electric charge storage portion FD by the transfer electrode TX2.

The capacitor electrode CEL1 overlaps with at least two of the eight sections B2 to B9 in the direction perpendicular to the back surface BS. In this example, the capacitor electrode CEL1 overlaps with two sections B2 and B6. However, the portion overlapping with the eight sections B2 to B9 is less than a half of the capacitor electrode CEL1. The major portion of the capacitor electrode CEL1 overlaps with the non-overlapping region B0. The capacitor electrode CEL1 in this example is integrally formed with the gate electrode CTRL in FIG. 2. The capacitor electrode CEL1 and the gate electrode CTRL illustrated in FIG. 2 are illustrated as an integrally formed electrode CTRL & CEL1 in FIG. 3. The portions of the gate electrodes RES, SF, and SEL overlapping with the eight sections B2 to B9 are less than a half of the gate electrodes RES, SF, and SEL, respectively. The major portions of the gate electrodes RES, SF, and SEL overlap with the non-overlapping region B0. The contact plugs PDD, PFD, and OUT overlap with the non-overlapping region B0.

Figure 4A:
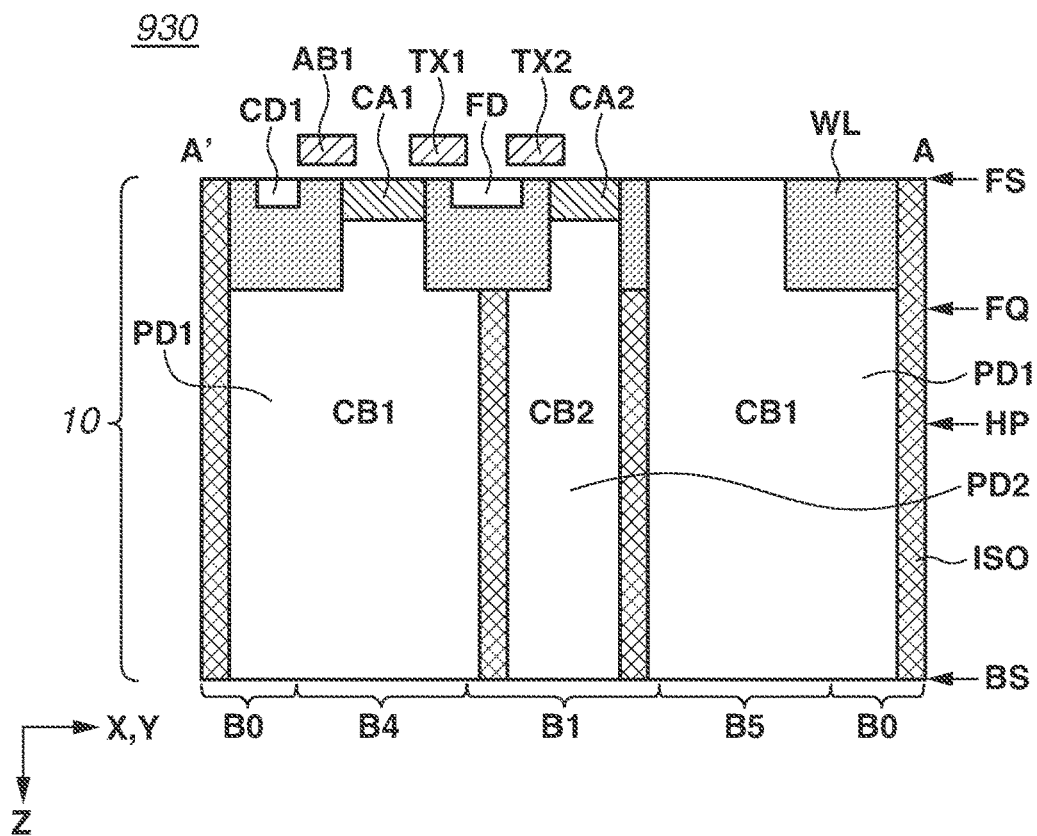
FIG. 4A is a schematic view illustrating an example of a semiconductor apparatus.
Figure 4B:
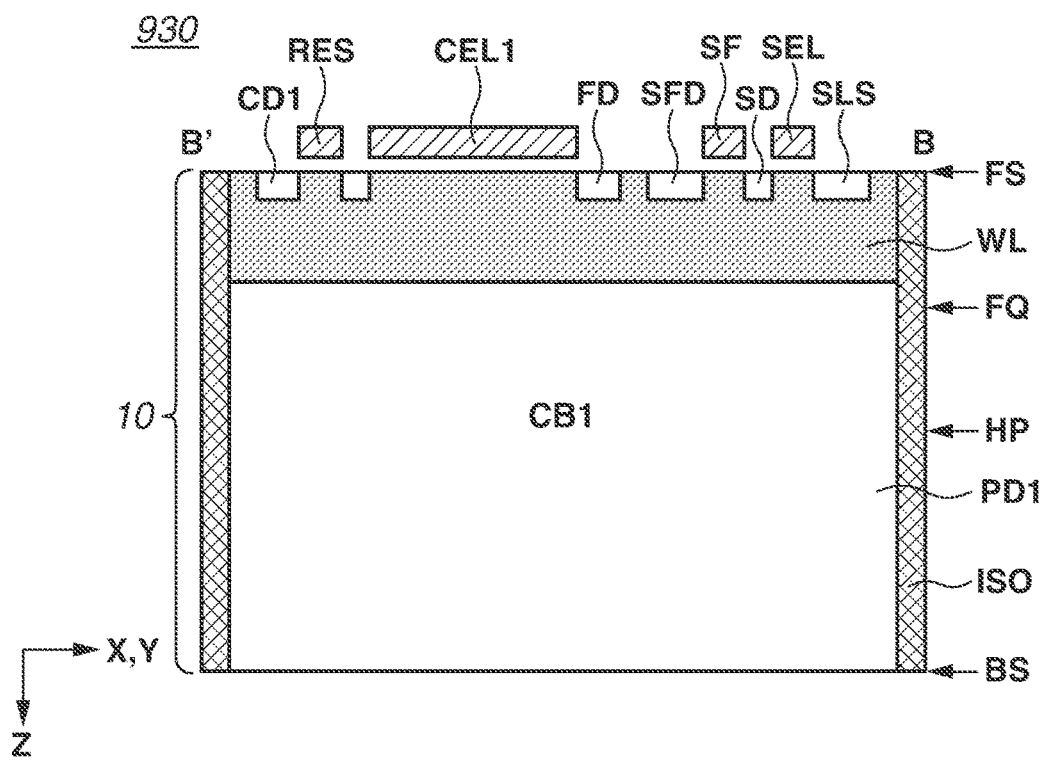
FIG. 4B is a schematic view illustrating an example of a semiconductor apparatus.

FIG. 4A is a cross-sectional view schematically illustrating the pixel taken along the A-A' line in FIG. 3. FIG. 4B is a cross-sectional view schematically illustrating the pixel taken along the B-B' line in FIG. 3. FIG. 5 is a cross-sectional view schematically illustrating the pixel taken along the A-C-D-E-F-G-H line in FIG. 3. Referring to FIGS. 4 and 5, the unshaded regions in the semiconductor layer 10 are semiconductor regions of the first conductivity type (n-type in this example). Referring to FIGS. 4 and 5, parts of the unshaded regions in the semiconductor layer 10 are the semiconductor regions of the second conductivity type (p-type in this example).

As illustrated in FIG. 4A, the outer photodiode PD1 and the inner photodiode PD2 are electrically and optically separated from each other by the separation region ISO for up to a certain depth in the semiconductor layer 10 from the plane HP. The separation region ISO may include a semiconductor region and/or an insulator region having the conductivity type (p-type in this example) opposite to the conductivity type (n-type in this example) of the electric charge storage portion FD. The insulator region that may form the separation region ISO may be disposed in the grooves DT described above.

On the other hand, as illustrated in FIGS. 4A and 4B, an n-type semiconductor region CB1 is disposed in the semiconductor layer 10 so as to overlap with the eight sections B2 to B9 in the Z direction perpendicular to the back surface BS. The semiconductor region CB1 is disposed at least in the range where the distance from the front surface FS is D or larger and less than 3×D. The distance D is represented by D=T/4 where T denotes the thickness T of the semiconductor layer 10 (the distance between the front surface FS and the back surface BS) illustrated in FIG. 1C. Since the distance between the plane FQ and the front surface FS is T/4, the range where the distance from the front surface FS is less than D refers to the range between the plane FQ and the front surface FS, and the range where the distance from the front surface FS is D or larger refers to the range between the plane FQ and the back surface BS. Likewise, the range where the distance from the front surface FS is less than 3×D refers to the range between the plane BQ and the front surface FS, and the range where the distance from the front surface FS is 3×D or larger refers to the range between the plane BQ and the back surface BS. Therefore, the range where the distance from the front surface FS is D or larger and less than 3×D refers to the range between the planes FQ and BQ. The semiconductor region CB1 is disposed at least in the range between the planes FQ and BQ. In this example, the semiconductor region CB1 is also disposed in the range between the plane FQ and the front surface FS, and in the range between the plane BQ and the back surface BS. In the semiconductor layer 10, an n-type semiconductor region CA1 is disposed to overlap with at least one (section B4 in the example) of the eight sections B2 to B9 in the Z direction perpendicular to the back surface BS. The semiconductor region CA1 is disposed at least in the range where the distance from the front surface FS is less than D. The n-type semiconductor regions CB1 and CA1 are the cathode of the photodiode PD1 and may function as photoelectric conversion members. Since the semiconductor region CA1 has a higher impurity density than the semiconductor region CB1, the semiconductor region CA1 functions as a charge collection portion where the electric charges generated in the semiconductor region CB1 are collected. The electric charges generated in the semiconductor region CB1 are collected in the semiconductor region CA1 and then transferred from the semiconductor region CA1 to the electric charge storage portion FD. Since the electric charges collected in the charge collection portion are accumulated in the charge collection portion, the semiconductor region CA1 can also be referred to as an electric charge accumulation region. The semiconductor region CB1 is also disposed in the range where the distance from the front surface FS is less than D, and the semiconductor region CB1 continues to the semiconductor region CAE The semiconductor region CB1 is also disposed in the range where the distance from the front surface FS is 3×D or larger. The semiconductor region CB1 overlaps with the non-overlapping region B0. When the semiconductor region CB1 is expanded up to the non-overlapping region B0, the cathode of the photodiode PD1 increases in volume. Then, the area of the PN juncture surface of the photodiode PD1 increases to increase the juncture capacitance of the photodiode PD1. This increases the maximal electric charge amount (saturated charge amount) that can be accumulated in the photodiode PD1. When the signal based on electric charges of the photodiode PD1 is combined with the signal based on electric charges of the photodiode PD2, increasing the saturated charge amount of the photodiode PD1 is advantageous in expanding the dynamic range of the signal obtained through the combination. Increasing the saturated charge amount of the photodiode PD1 in a case where the photodiode PD1 has a lower sensitivity than the photodiode PD2 is more advantageous in expanding the dynamic range than in a case where the photodiode PD1 has a higher sensitivity than the photodiode PD2.

The distance D (μm) is represented by D=T/4 using the thickness T (the distance between the front surface FS and the back surface BS) of the semiconductor layer 10 illustrated in FIG. 1C. Since the distance between the plane HP and the front surface FS is T/2 or larger, the range where the distance from the front surface FS is D or larger refers to the range between the plane HP and the back surface BS. The range where the distance from the front surface FS is less than D/2 refers to the range between the plane FQ and the front surface FS. The range where the distance from the front surface FS is D/2 or larger and less than D refers to the range between the planes FQ and HP.

Likewise, in the semiconductor layer 10, an n-type semiconductor region CB2 is disposed to overlap with the section B1 in the Z direction perpendicular to the back surface BS. The semiconductor region CB2 is disposed at least in the range where the distance from the front surface FS is D or larger and less than 3×D. In the semiconductor layer 10, an n-type semiconductor region CA2 is disposed to overlap with the section B1 in the Z direction perpendicular to the back surface BS. The semiconductor region CA2 is disposed at least in the range where the distance from the front surface FS is less than D. The n-type semiconductor regions CB2 and CA2 are the cathode of the photodiode PD2 and may function as photoelectric conversion members. Sine the semiconductor region CA2 has a higher impurity density than the semiconductor region CB2, the semiconductor region CA2 functions as a charge collection portion where the electric charges generated in the semiconductor region CB2 are collected. More specifically, the electric charges generated in the semiconductor region CB2 are collected in the semiconductor region CA2 and then transferred from the semiconductor region CA2 to the electric charge storage portion FD. Since the electric charges collected in the charge collection portion are accumulated in the charge collection portion, the semiconductor region CA2 can also be referred to as an electric charge accumulation region. The semiconductor region CB2 is also disposed in the range where the distance from the front surface FS is less than D (μm), and the semiconductor region CB2 continues to the semiconductor region CA2. The semiconductor region CB2 is also disposed in the range where the distance from the front surface FS is 3×D or larger.

In the semiconductor layer 10, a p-type semiconductor region WL is disposed between the semiconductor region CB1 and the front surface FS in the Z direction perpendicular to front surface FS. The semiconductor region WL is disposed at least in the range where the distance from the front surface FS is less than D. More specifically, the semiconductor region WL is disposed at least in the range between the plane FQ and the front surface FS. The semiconductor region WL is disposed in both the shallower range than the bottom of the element separation portion 23 and the deeper range than the bottom of the element separation portion 23 in FIG. 1. The depth of the element separation portion 23 can be approximated with the thickness H of the electrodes 25 (see FIG. 1C). Therefore, the semiconductor region WL is disposed in the range where the distance from the front surface FS is less than the distance S that equals the thickness H, and the range where the distance from the front surface FS is equal to or larger than the distance S that equals the thickness H. The semiconductor region WL is disposed to overlap with at least one of the eight sections B2 to B9 in the Z direction perpendicular to the back surface BS. In this example, the semiconductor region WL overlaps with all of the eight sections B2 to B9 in the Z direction perpendicular to the back surface BS. However, in this example, the semiconductor region WL overlaps only with a part of each of the eight sections B2 to B9 in the Z direction perpendicular to the back surface BS. The semiconductor region WL overlaps with the non-overlapping region B0 in the Z direction perpendicular to the back surface BS. The semiconductor region WL surrounds the semiconductor region CA1 between the front surface FS and the plane FQ. The semiconductor region WL surrounds the semiconductor region CB1 between the front surface FS and the plane FQ. The semiconductor region WL also surrounds the n-type semiconductor region as the cathode of the photodiode PD2 between the front surface FS and the plane FQ.

This p-type semiconductor region WL is the anode of the photodiode PD2 that forms a PN junction with the semiconductor regions CB1 and CAL and may function as a photoelectric conversion member. The semiconductor region WL is supplied with a fixed potential. The fixed potential supplied to the semiconductor region WL is, for example, the contact potential VSS as illustrated in FIG. 2. The p-type semiconductor region WL may function as a barrier between the electric charge storage portion FD, the electric charge discharge portion CD1, the drain SFD of the amplifying transistor 316, the source SLS of the selection transistor 318 and the semiconductor regions CB1 and CAE The p-type semiconductor region WL may also function as a channel-forming region under the electrodes 25.

To prevent noise charges generated in the vicinity of the front surface FS from entering the semiconductor region CAL a front surface impurity region (not illustrated) as a p-type semiconductor region having a higher impurity density than the p-type semiconductor region WL may be disposed between the semiconductor region CA1 and the front surface FS. Likewise, to prevent noise charges generated in the vicinity of the front surface FS from entering the semiconductor region CB1, a front surface impurity region (not illustrated) as a p-type semiconductor region having a higher impurity density than the p-type semiconductor region WL may be disposed between the semiconductor region CB1 and the front surface FS. The depth of these front surface impurity regions may be shallower than that of the element separation portion 23 illustrated in FIG. 1. More specifically, it is preferable that the distance between the front surface FS and the n-type impurity region CA1 and/or the distance between the front surface FS and the n-type impurity region CB1 are smaller than the depth of the element separation portion 23. Therefore, the distance between the front surface FS and the n-type impurity region CA1 and/or the distance between the front surface FS and the n-type impurity region CB1 may be smaller than the distance S that equals the thickness H of electrode 25.

In the semiconductor layer 10, the n-type semiconductor region is disposed between the semiconductor region WL and the front surface FS in the Z direction perpendicular to front surface FS. The n-type semiconductor regions between the semiconductor region WL and the front surface FS include the electric charge storage portion FD and the electric charge discharge portion CD1. The n-type semiconductor regions between the semiconductor region WL and the front surface FS include the source and the drain of the pixel transistor. Examples of sources and drains of pixel transistors include the drain SFD of the amplifying transistor 316, a source/drain SD shared by the amplifying transistor 316 and the selection transistor 318, and the source SLS of the selection transistor 318.

As understood from FIGS. 3 and 4B, at least two (three in this example) of the gate electrodes RES, CTRL, and SEL are arranged along the column direction (Y direction). The three gate electrodes RES, CTRL and SEL are arranged on a straight line. Each of the gate electrodes RES, CTRL, and SEL is connected with row wirings commonly connected to a plurality of pixels included in the pixel row. Arranging the gate electrodes RES, CTRL, and SEL along the column direction and/or on a straight line improves the operation accuracy of the pixel circuit 300. The gap between the row wiring connected to the gate electrode RES, the row wiring connected to the gate electrode CTRL, and the row wiring connected to the gate electrode SEL can be widened, making it possible to reduce crosstalk between row wirings. For a similar reason, at least two (three in this example) of the transfer electrodes TX1, TX2, and AB1 are arranged along the column direction (Y direction). The three transfer electrodes TX1, TX2, and AB1 are arranged on a straight line.

As understood from FIGS. 3 and 4, the p-type semiconductor region WL is formed to overlap with a part of the n-type semiconductor region CB1 of the outer photodiode PD1 in the Z direction. As described above, the pixel transistor is formed inside the semiconductor region WL. More specifically, the pixel transistors are disposed to planarly overlap with the region occupied by the n-type semiconductor region CB1 of the outer photodiode PD1 in the plane HP. This arrangement enables reducing the unit pixel area in comparison with a case where the pixel transistors are arranged only outside the outer photodiode PD1 (non-overlapping region B0). This enables preventing the increase in the chip area and the decrease in the number of pixels. All of the pixel transistors are disposed to planarly overlap with the n-type semiconductor region CB1 of the outer photodiode PD1 in the plane HP. However, to obtain the above-described effect, at least a part of the pixel transistors needs to overlap with the n-type semiconductor region CB1.

Figure 5A:
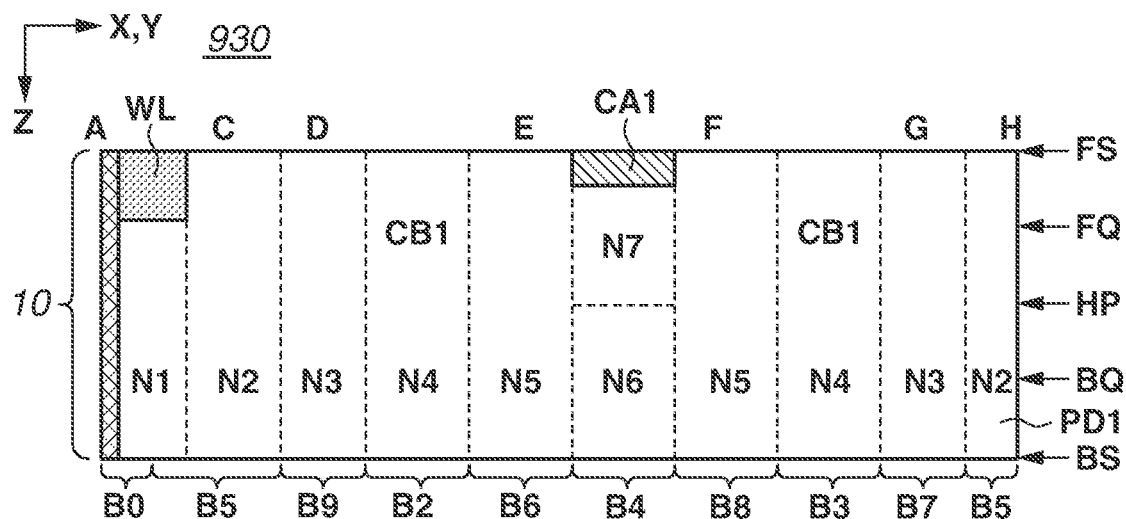
FIG. 5A is a schematic view illustrating an example of a semiconductor apparatus.
Figure 5B:
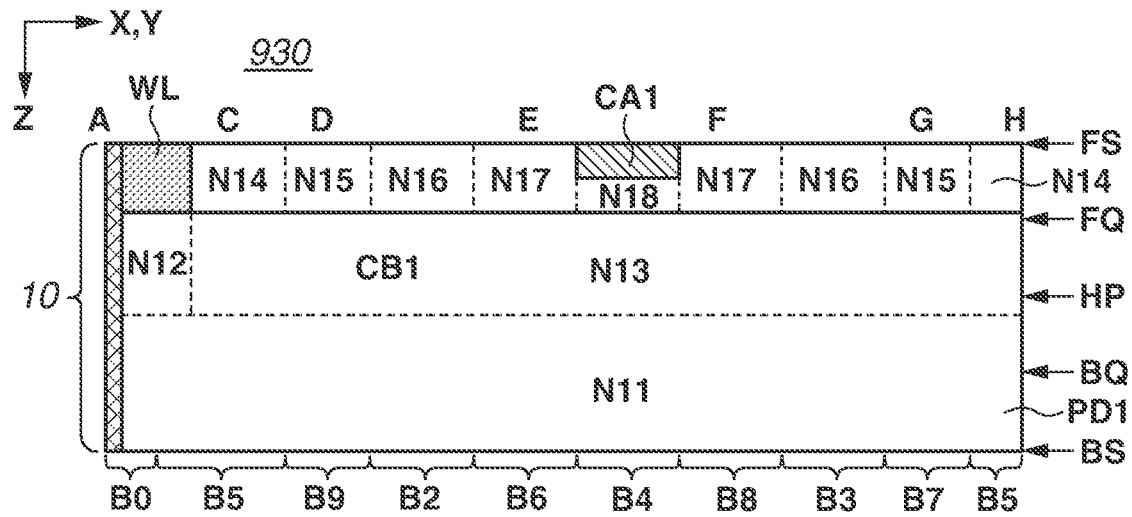
FIG. 5B is a schematic view illustrating an example of a semiconductor apparatus.

FIGS. 5A and 5B illustrate an example of an impurity density distribution of the outer photodiode PD1 in the A-C-D-E-F-G-H cross-section. FIG. 5A illustrates the impurity densities of the n-type semiconductor region CB1, i.e., densities N1, N2, N3, N4, N5, N6, N7, and N8 for each portion of the n-type semiconductor region CB1. FIG. 5B illustrates the impurity densities of the n-type semiconductor region CB1, i.e., densities N11, N12, N13, N14, N15, N16, N17, and N18 for each portion of the n-type semiconductor region CB1. Since the impurity densities have a relation $N1<N2<N3<N4<N5<N6<N7<N8$, the potential depths of the n-type semiconductor region CB1 have a relation $N1<N2<N3<N4<N5<N6<N7<N8$. The potential heights for electrons also have a relation $N1<N2<N3<N4<N5<N6<N7<N8$. Since the impurity densities have a relation $N11<N12<N13<N14<N15<N16<N17<N18$, the potential depths of the n-type semiconductor region CB1 have a relation $N11<N12<N13<N14<N15<N16<N17<N18$. The potential heights for electrons also have a relation $N11<N12<N13<N14<N15<N16<N17<N18$.

The relations in FIGS. 5A and 5B may be combined. For example, the portions overlapping with the sections B2 and B3 may have a density range $N4'<N4<N4''$ that satisfies $N3<N4'<N4<N4''<N5$. The density of the portions overlapping with the sections B2 and B3 may be set to satisfy $N4'\leq N11<N13<N16<N4''$.

The example in FIG. 5A will be described below. The example in FIG. 5A is characterized in the impurity density of the semiconductor region CB1 in the range between the planes FQ and BQ, and will be described below mainly centering on this range. The semiconductor region CB1 includes a portion with the density N6 overlapping with the section B4 in the Z direction perpendicular to the back surface BS. The semiconductor region CB1 includes a portion with the density N4 overlapping with the section B2 in the Z direction perpendicular to the back surface BS. The semiconductor region CB1 includes a portion with the density N4 overlapping with the section B3 in the Z direction perpendicular to the back surface BS. The semiconductor region CB1 includes a portion with the density N2 overlapping with the section B5 in the Z direction perpendicular to the back surface BS. The impurity density of the portion with the density N6 is higher than that of the portion with the density N4. The impurity density of the portion with the density N2 is lower than that of the portion with the density N4. The semiconductor region CB1 includes a portion with the density N5 overlapping with the section B6 in the Z direction perpendicular to the back surface BS. The semiconductor region CB1 includes a portion with the density N5 overlapping with the section B8 in the Z direction perpendicular to the back surface BS. The semiconductor region CB1 includes a portion with the density N3 overlapping with the section B7 in the Z direction perpendicular to the back surface BS. The semiconductor region CB1 includes a portion with the density N3 overlapping with the section B9 in the Z direction perpendicular to the back surface BS. The impurity density of the portion with the density N5 is higher than that of the portion with the density N3.

The example in FIG. 5B will be described below. The example in FIG. 5B is characterized in the impurity density of the semiconductor region CB1 in the range between the plane FQ and the front surface FS, and will be described below mainly centering on this range. The semiconductor region CB1 includes a portion with the density N18 overlapping with the section B4 in the Z direction perpendicular to the back surface BS. The semiconductor region CB1 includes a portion with the density N16 overlapping with the section B2 in the Z direction perpendicular to the back surface BS. The semiconductor region CB1 includes a portion with the density N16 overlapping with the section B3 in the Z direction perpendicular to the back surface BS. The semiconductor region CB1 includes a portion with the density N14 overlapping with the section B5 in the Z direction perpendicular to the back surface BS. The impurity density of the portion with the density N18 is higher than that of the portion with the density N16. The impurity density of the portion with the density N14 is lower than that of the portion with the density N16. The semiconductor region CB1 includes a portion with the density N17 overlapping with the section B6 in the Z direction perpendicular to the back surface BS. The semiconductor region CB1 includes a portion with the density N17 overlapping with the section B8 in the Z direction perpendicular to the back surface BS. The semiconductor region CB1 includes a portion with the density N15 overlapping with the section B7 in the Z direction perpendicular to the back surface BS. The semiconductor region CB1 includes a portion with the density N15 overlapping with the section B9 in the Z direction perpendicular to the back surface BS. The impurity density of the portion with the density N17 is higher than that of the portion with the density N15.

The electric charges can be effectively collected by sequentially increasing the impurity density and the potential depth from the furthest portion from the semiconductor region CA1 as a charge collection portion of the outer photodiode PD1. Therefore, effects of improving the saturated charge amount and the sensitivity can be expected. The impurity density distribution needs to sequentially increase from the furthest portion to the closer portion from the semiconductor region CA1 of the outer photodiode PD1. The potential distribution needs to sequentially increase from the furthest portion to the closer portion from the semiconductor region CA1 of the outer photodiode PD1. Therefore, the method for forming the impurity density distribution is not limited to the form illustrated in FIG. 5. Although, in FIG. 5, the impurity density distribution is gradually changed, it may be incrementally changed for a similar reason.

Second Exemplary Embodiment

Figure 6:
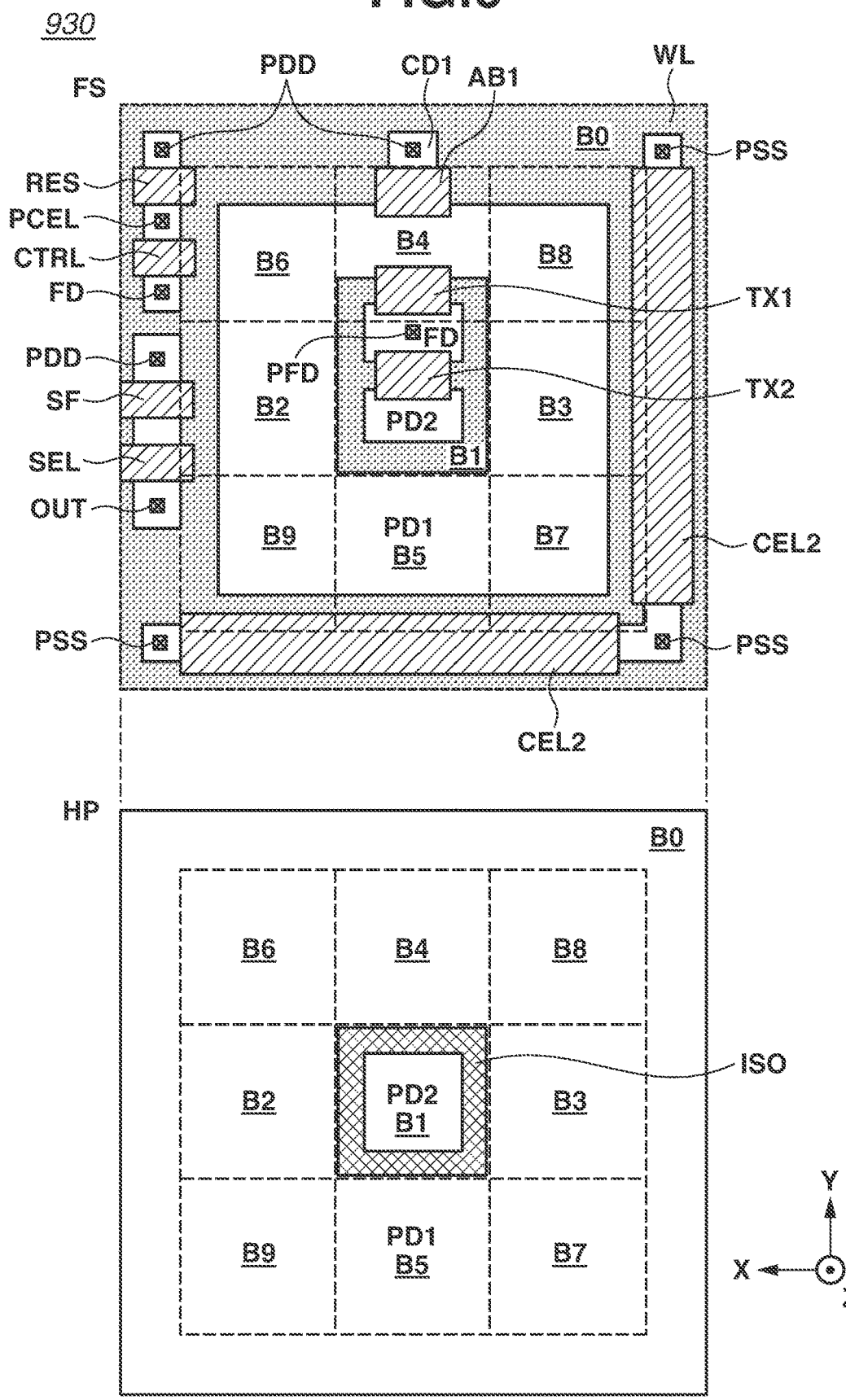
FIG. 6 is a schematic view illustrating an example of a semiconductor apparatus.

A second exemplary embodiment will be described below with reference to FIG. 6. In the descriptions of the second exemplary embodiment, points that can be similar to those in the first exemplary embodiment will be omitted.

The second exemplary embodiment differs from the first exemplary embodiment in the arrangements of capacitor electrodes. Although the capacitor CINC1 illustrated in FIG. 2 is used in the first exemplary embodiment, the capacitor CINC2 illustrated in FIG. 2 will be used in the second exemplary embodiment. The capacitor electrode CEL2 is connected to the capacitor electrode CEL2 via a contact plug PCEL connected to a terminal of the control transistor 314 including the gate electrode CTRL. The capacitor electrode CEL2 according to the second exemplary embodiment is made larger in area than the capacitor electrode CEL1 according to the first exemplary embodiment, resulting in a larger capacitance of the capacitor CINC2. This increases the effect of the dynamic range expansion. To expand the dynamic range in the high-luminance direction, it is effective to increase the area of the electrode CEL1 or CEL2 of the capacitor CINC1 or CINC2 to increase the capacitance of the capacitor CINC1 or CINC2, respectively. However, to accomplish this in the first exemplary embodiment, it is necessary to increase the area of the gate electrode CTRL integrally formed with the capacitor electrode CELE This increases the load on the control line that is connected to the gate electrode CTRL and transmits a signal for controlling the ON/OFF state of the control transistor 314. Accordingly, increasing the area of the gate electrode CTRL gradually makes it hard to drive the control line. On the other hand, in the configuration according to the second exemplary embodiment, the control transistor 314 having the gate electrode CTRL needs to operate as a switch. To increase the capacitance of the capacitor CINC2, the area of the capacitor electrode CEL2 needs to be increased. More specifically, it is easy to increase the capacitance of the capacitor CINC2 without increasing the load on the control line connected to the control transistor 314 having the gate electrode CTRL. This provides an advantage in performing the dynamic range expansion in the high-luminance direction. The capacitor electrode CEL2 having a large area overlaps with five sections B8, B3, B7, B5, and B9. The major portion of the capacitor electrode CEL2 overlaps with the non-overlapping region B0. Although, in this example, the capacitor electrode CEL2 is divided into the capacitor electrode CEL2 including the portion overlapping with the sections B8 and B3, and the capacitor electrode CEL2 including the portion overlapping with the sections B5 and B9, they may be integrally formed.

Third Exemplary Embodiment

Figure 7:
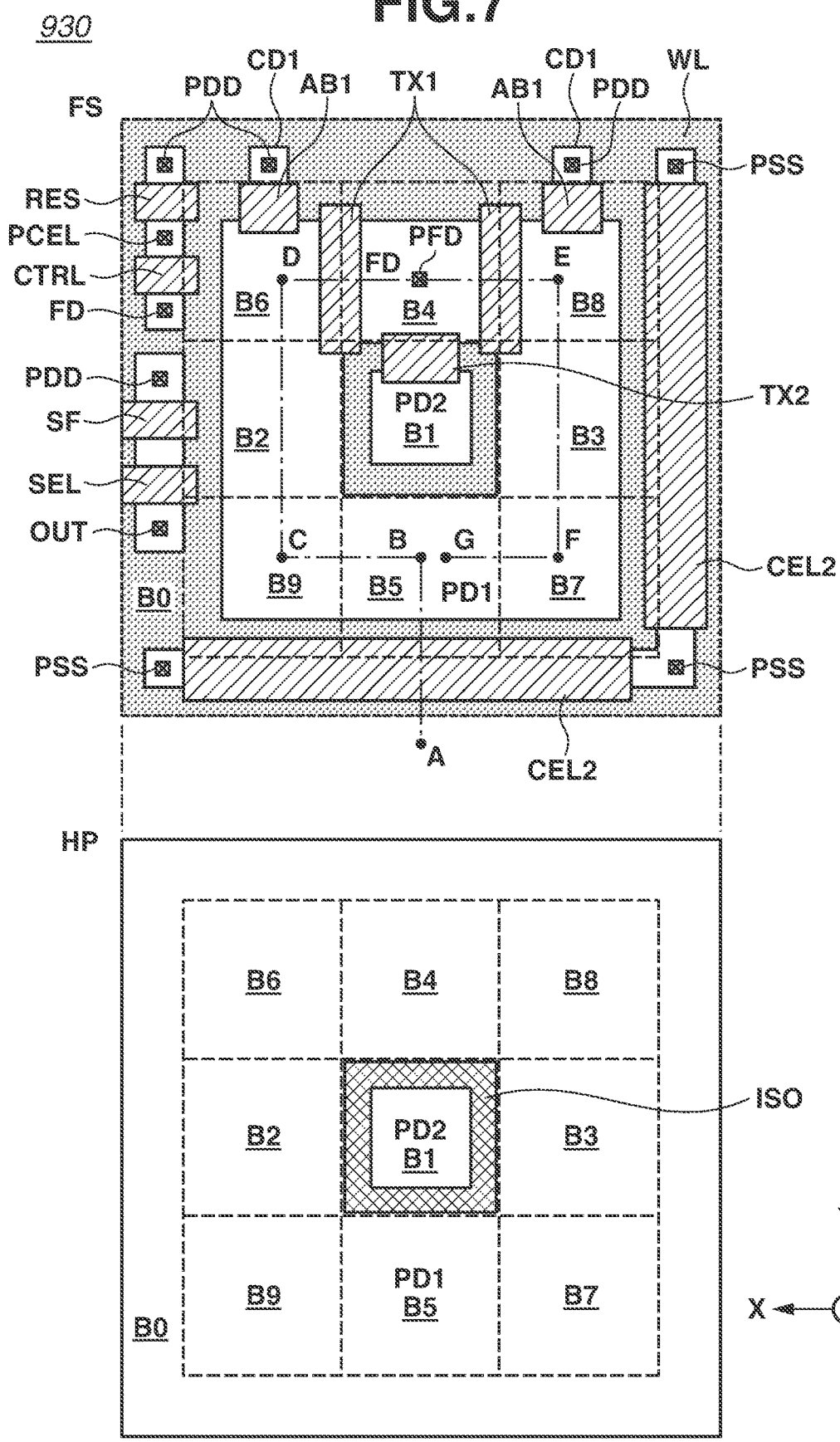
FIG. 7 is a schematic view illustrating an example of a semiconductor apparatus.
Figure 9A:
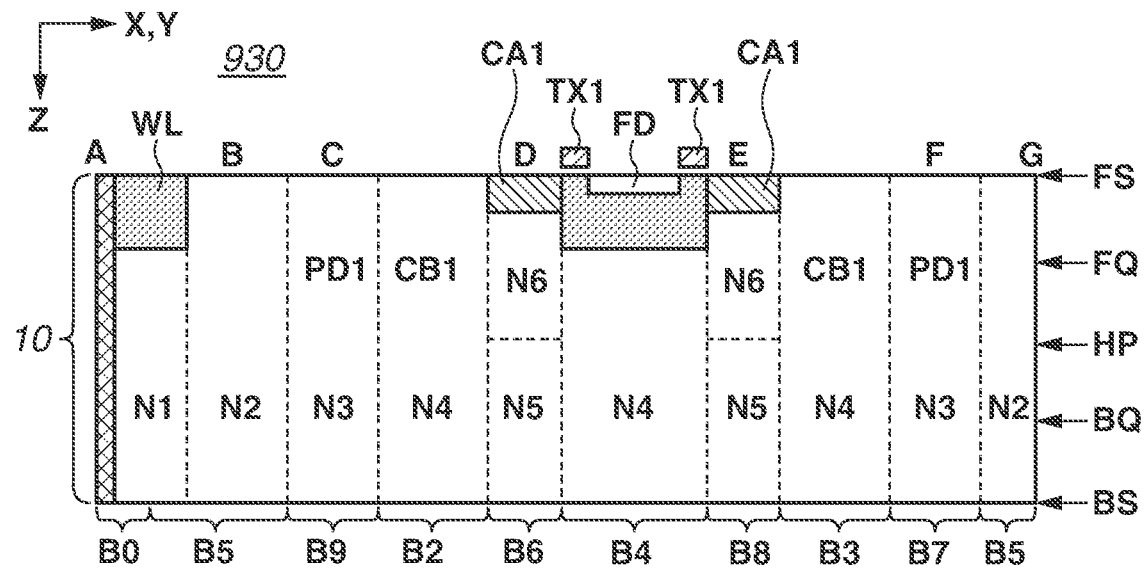
FIG. 9A is a schematic view illustrating an example of a semiconductor apparatus.

A third exemplary embodiment will be described below with reference to FIGS. 7 and 9. FIG. 9A is a cross-sectional view taken along the A-G line in FIG. 7. In the descriptions of the third exemplary embodiment, points that can be similar to those in the second exemplary embodiment will be omitted. The third exemplary embodiment differs from the second exemplary embodiment in that one photodiode PD1 is provided with two transfer electrodes TX1. The electric charge storage portion FD overlaps with the section B4. One of the two transfer electrodes TX1 overlaps with the section B4 and/or the section B6. The other of the two transfer electrodes TX1 overlaps with the section B4 and/or the section B8. As illustrated in FIG. 9A, the semiconductor region CA1 as a charge collection portion of the photodiode PD1 is disposed at two different positions to overlap with the each of the sections B6 and B8. The semiconductor region WL and the electric charge storage portion FD are disposed between the semiconductor region CA1 overlapping with the section B6 and the semiconductor region CA1 overlapping with the section B8. The electric charges generated in the photoelectric conversion members overlapping with the sections B5, B9, B2, B6, and B4 are mainly collected in the semiconductor region CA1 overlapping with the section B6. The electric charges generated in the photoelectric conversion members overlapping with the sections B5, B7, B9, B2, B8, and B4 are mainly collected in the semiconductor region CA1 overlapping with the section B8. Disposing the plurality of semiconductor regions CA1 as charge collection portions in this way enables improving the charge collection efficiency. The contact plug PFD connected to the electric charge storage portion FD is positioned between one of the two transfer electrodes TX1 and the other thereof. Disposing two transfer electrodes TX1 in this way enables improving the efficiency of charge transfer from the photodiode PD1 to the electric charge storage portion FD. The present exemplary embodiment differs from the second exemplary embodiment in that one photodiode PD1 is provided with two pairs of the transfer electrode AB1 and the electric charge discharge portion CD1. This configuration enables preventing blooming of electric charges from the photodiode PD1.

Fourth Exemplary Embodiment

Figure 8:
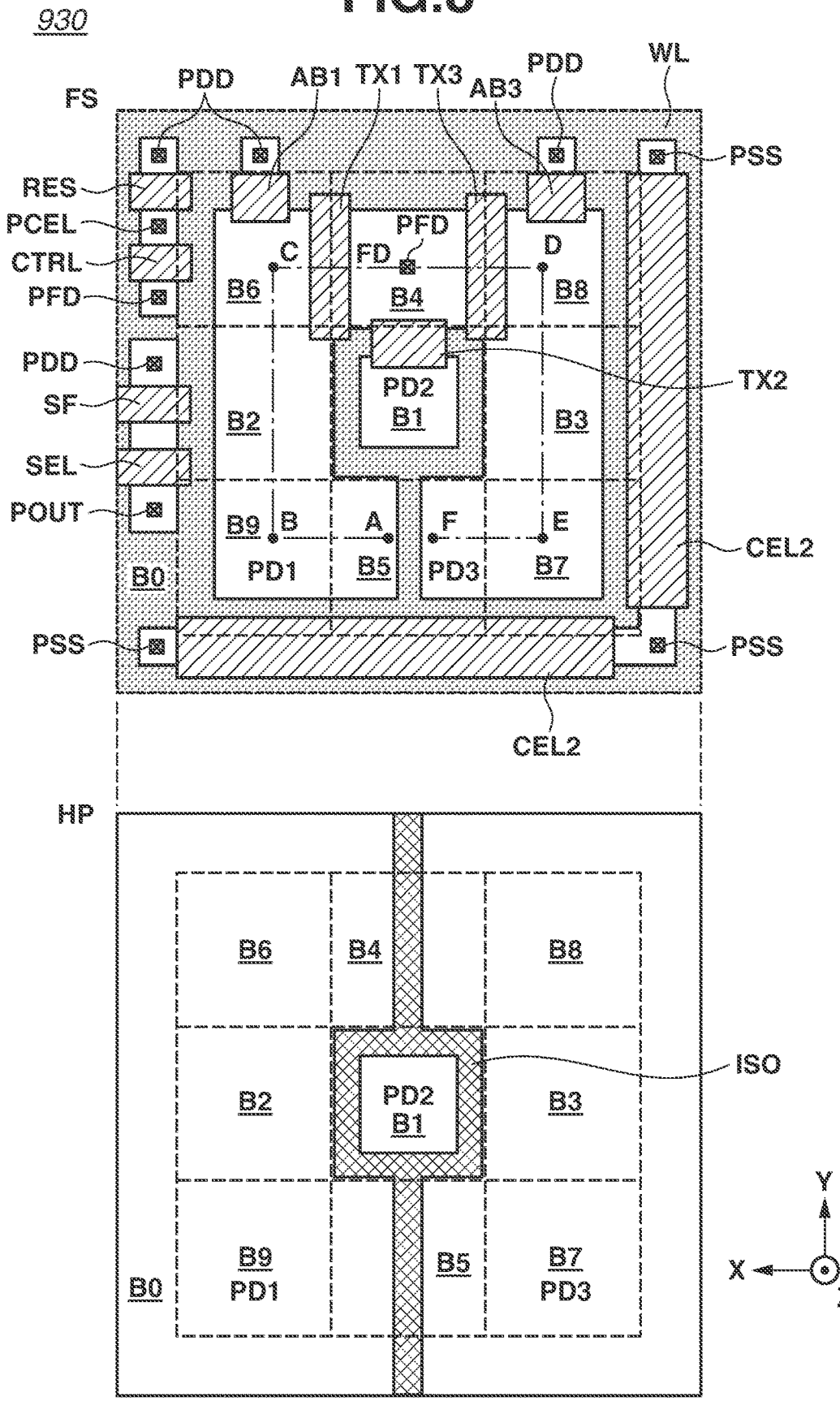
FIG. 8 is a schematic view illustrating an example of a semiconductor apparatus.
Figure 9B:
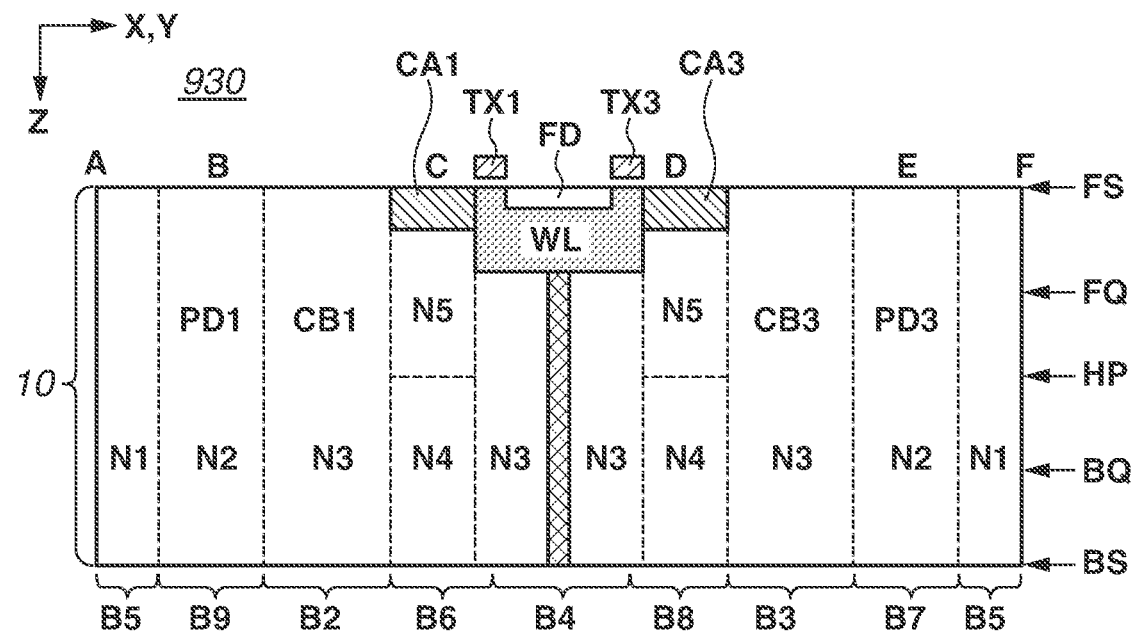
FIG. 9B is a schematic view illustrating an example of a semiconductor apparatus.

A fourth exemplary embodiment will be described below with reference to FIG. 8. According to the fourth exemplary embodiment, the semiconductor apparatus 930 includes the components positioned at the portion W surrounded by the broken lines in FIG. 2, but does not need to include the components positioned at the portion V surrounded by the broken lines in FIG. 2. FIG. 9B is a cross-sectional view taken along the A-F line in FIG. 8. In the descriptions of the fourth exemplary embodiment, points that can be similar to those in the third exemplary embodiment will be omitted. The fourth exemplary embodiment includes the photodiodes PD1 and PD3 disposed on both sides of the photodiode PD2. In other words, the photodiode PD2 is positioned between the photodiodes PD1 and PD3. The photodiode PD1 has photoelectric conversion members overlapping with the sections B6, B2, B9, and B5. The photodiode PD3 has photoelectric conversion members overlapping with the sections B8, B3, B7, and B5. To separate the photodiodes PD1 and PD2 from each other, the separation region ISO is disposed between the photoelectric conversion member of the photodiode PD1 and the photoelectric conversion member of the photodiode PD2 at the position overlapping with the section B5. Disposing the photodiodes PD1 and PD3 in this way enables accurately performing pupil division based on the photodiodes PD1 and PD3. This makes it possible to accurately perform phase difference detection, focal point detection, distance measurement, and depth information acquisition based on the difference in output between the photodiodes PD1 and PD3.

The transfer gate 304 (see FIG. 2) including the transfer electrode TX1 is connected to the photodiode PD1, and the transfer gate 310 (see FIG. 2) including the transfer electrode TX3 is connected to the photodiode PD3. The transfer electrode TX1 overlaps with the section B4 and/or the section B6, and the transfer electrode TX3 overlaps with the section B4 and/or the section B8. As illustrated in FIG. 9B, the semiconductor region CA1 as the charge collection portion of the photodiode PD1 overlaps with the section B6, and the semiconductor region CA3 as the charge collection portion of the photodiode PD3 overlaps with the section B8. The semiconductor region CB1 as the photoelectric conversion member of the photodiode PD1 overlaps with the sections B5, B9, B2, and B6. The semiconductor region CB3 as the photoelectric conversion member of the photodiode PD3 overlaps with the sections B5, B7, B3, and B8. The contact plug PFD connected to the electric charge storage portion FD is positioned between the transfer electrodes TX1 and TX3.

Fifth Exemplary Embodiment

Figure 10:
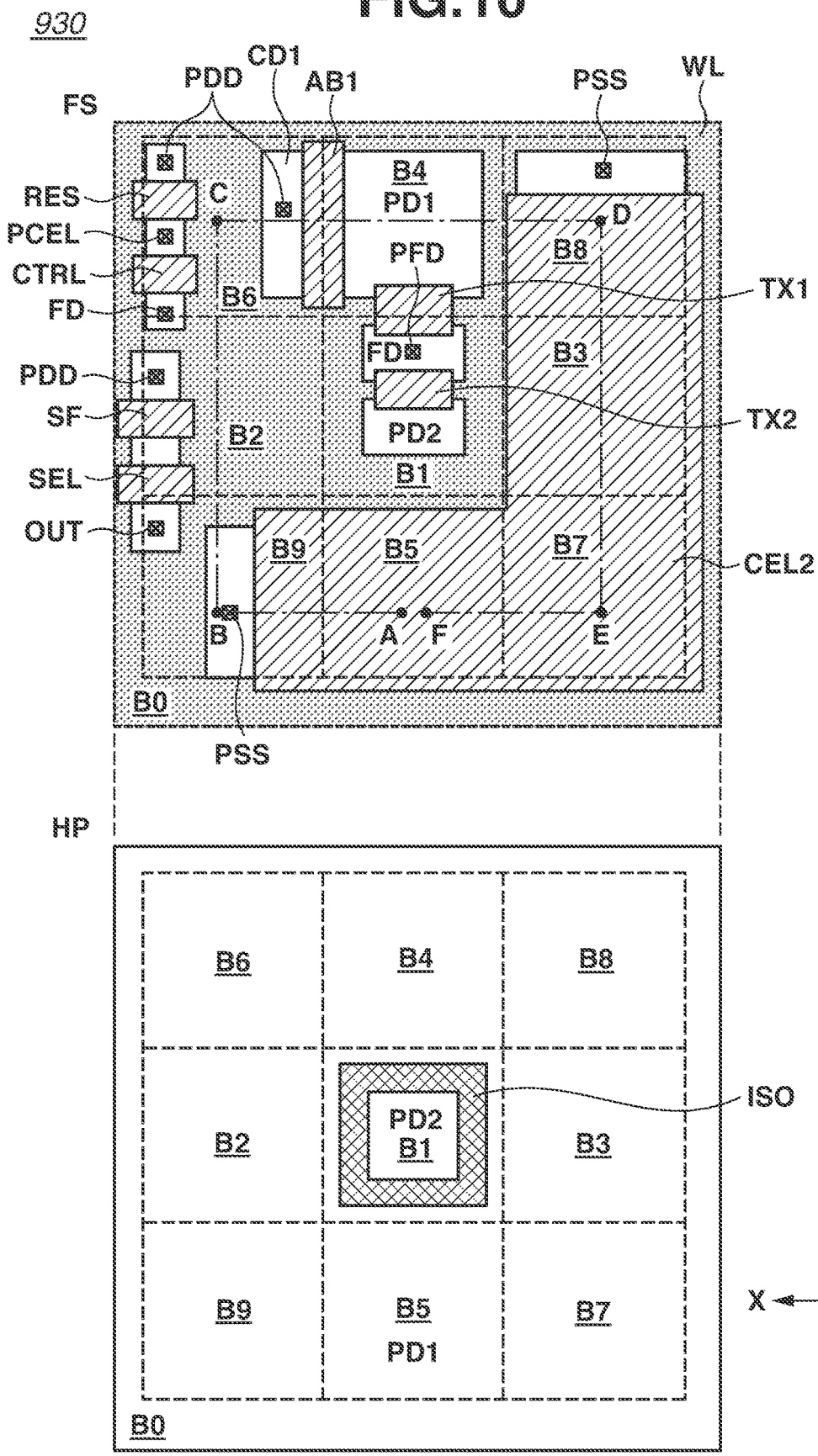
FIG. 10 is a schematic view illustrating an example of a semiconductor apparatus.
Figure 11:
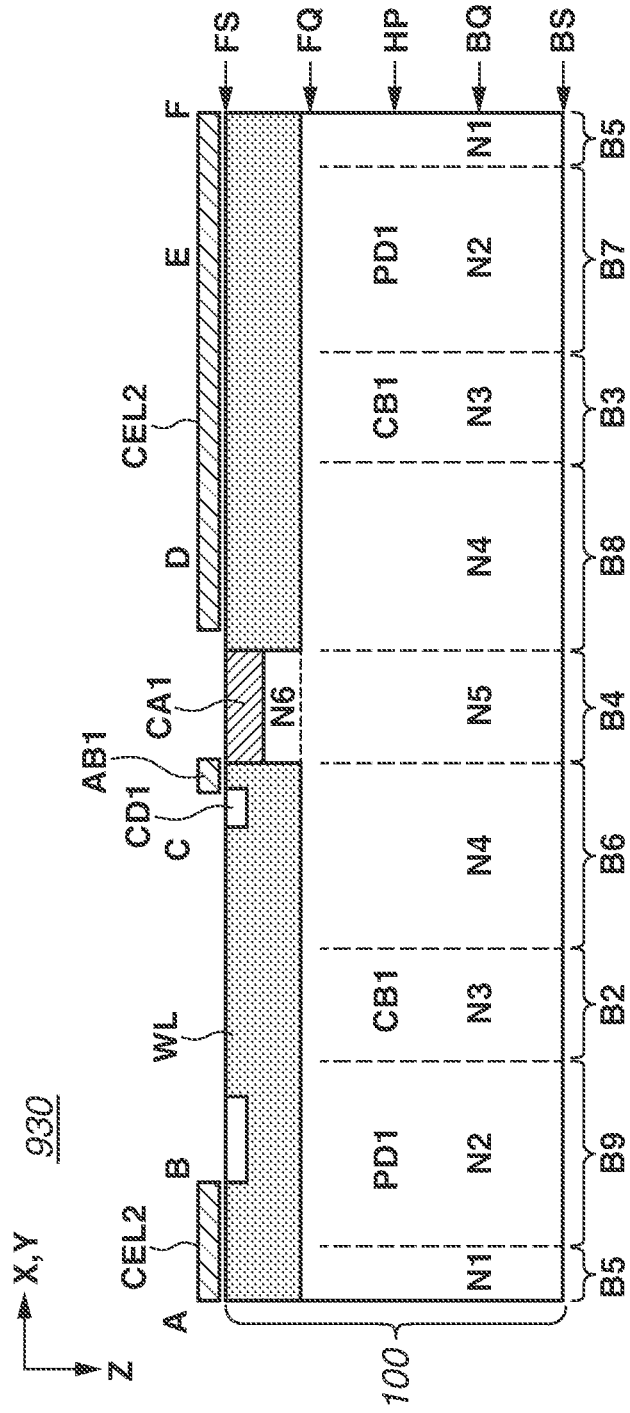
FIG. 11 is a schematic view illustrating an example of a semiconductor apparatus.

A fifth exemplary embodiment will be described below with reference to FIGS. 10 and 11. FIG. 11 is a cross-sectional view taken along the A-F line in FIG. 10. In the descriptions of the fifth exemplary embodiment, points that can be similar to those in the second exemplary embodiment will be omitted.

The fifth exemplary embodiment differs from the second exemplary embodiment in the arrangements of a capacitor electrode CEL and a P-type well WEL. In this example, the capacitor electrode CEL2 having a large area overlaps with five sections B8, B3, B7, B5, and B9. The major portion of each of the sections B8, B3, B7, B5, and B9 overlaps with the capacitor electrode CEL2. This enables dynamic range expansion in the high-luminance direction to a further extent than in the second exemplary embodiment. As illustrated in FIG. 11, the semiconductor region WL is disposed under the capacitor electrode CEL2. Therefore, the absolute majority of each of the sections B8, B3, B7, B5, and B9 overlaps with the semiconductor region WL. In this example, the electric charge discharge portion CD1 overlaps with the section B6. The transfer electrode AB1 overlaps with the section B4 and/or the section B6. The absolute majority of each of the gate electrodes RES, CTRL, SF, and SEL overlaps with the section B2 or B6.

Sixth Exemplary Embodiment

Figure 12:
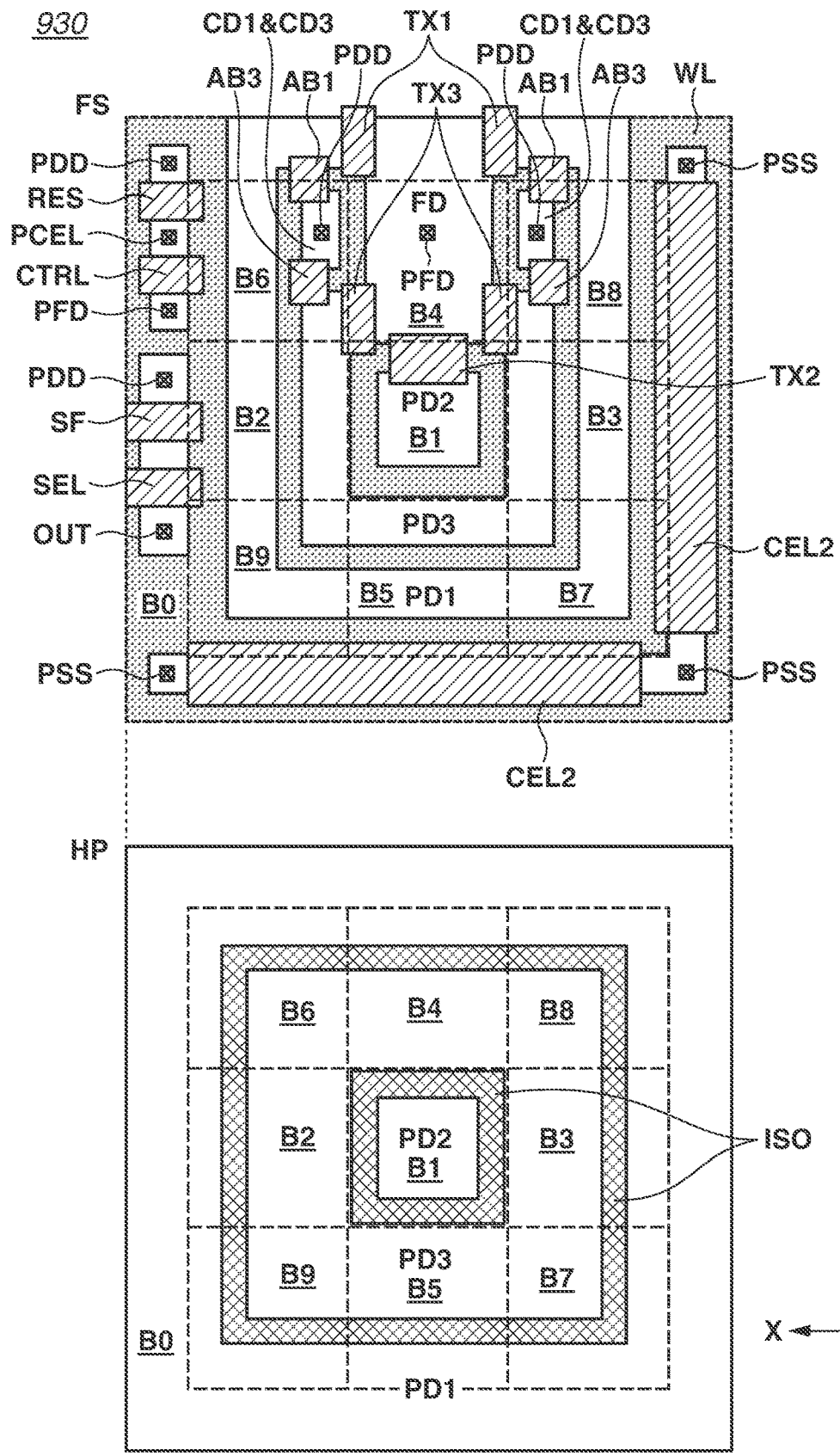
FIG. 12 is a schematic view illustrating an example of a semiconductor apparatus.

A sixth exemplary embodiment will be described below with reference to FIG. 12. According to the sixth exemplary embodiment, the semiconductor apparatus 930 includes the components positioned at the portion W surrounded by the broken lines in FIG. 2, but does not need to include the components positioned at the portion V surrounded by the broken lines in FIG. 2. In the descriptions of the sixth exemplary embodiment, points that can be similar to those in the second exemplary embodiment will be omitted. According to the sixth exemplary embodiment, the photodiode PD1 is positioned on both sides of the photodiode PD2, and the photodiode PD3 is positioned on both sides of the photodiode PD2. The photodiode PD3 is positioned between the photodiodes PD1 and PD2. To separate the photodiodes PD1 and PD2 from each other, the separation region ISO is disposed between the photoelectric conversion member of the photodiode PD1 and the photoelectric conversion member of the photodiode PD2 at the position overlapping with the section B5. The photodiodes PD1 and PD3 have photoelectric conversion members overlapping with the sections B2 to B6, B2, B9, and B5. The two charge collection portions of the photodiode PD1 are disposed in the non-overlapping region B0, and the two charge collection portions of the photodiode PD3 are disposed in the sections B6 and B8. The electric charge discharge portion CD1 connected to the transfer electrode AB1 and the electric charge discharge portion CD3 connected to the transfer electrode AB3 are common. The electric charge storage portion FD and the contact plug PFD overlap with the section B4. The two transfer electrodes TX3 overlap with the section B4. The transfer electrode TX1 overlaps with the non-overlapping region B0. One of the two transfer electrodes AB1 overlaps with the section B6 and/or the non-overlapping region B0, and the other of the two transfer electrodes AB1 overlaps with the section B8 and/or the non-overlapping region B0.

Seventh Exemplary Embodiment

Figure 15A:
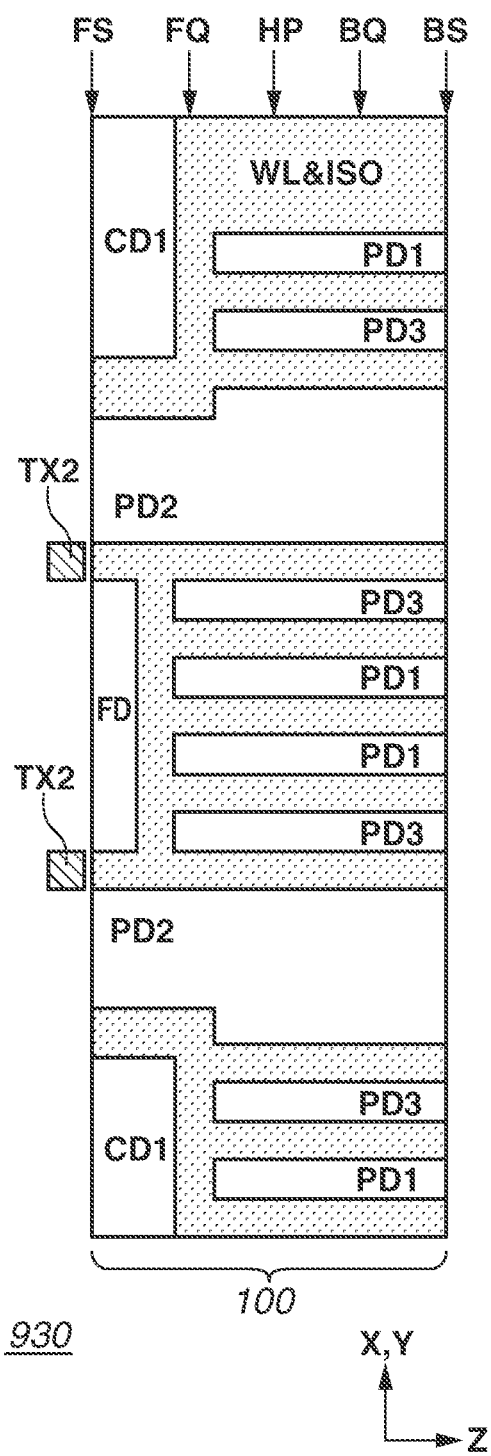
FIG. 15A is a schematic view illustrating an example of a semiconductor apparatus.
Figure 15B:
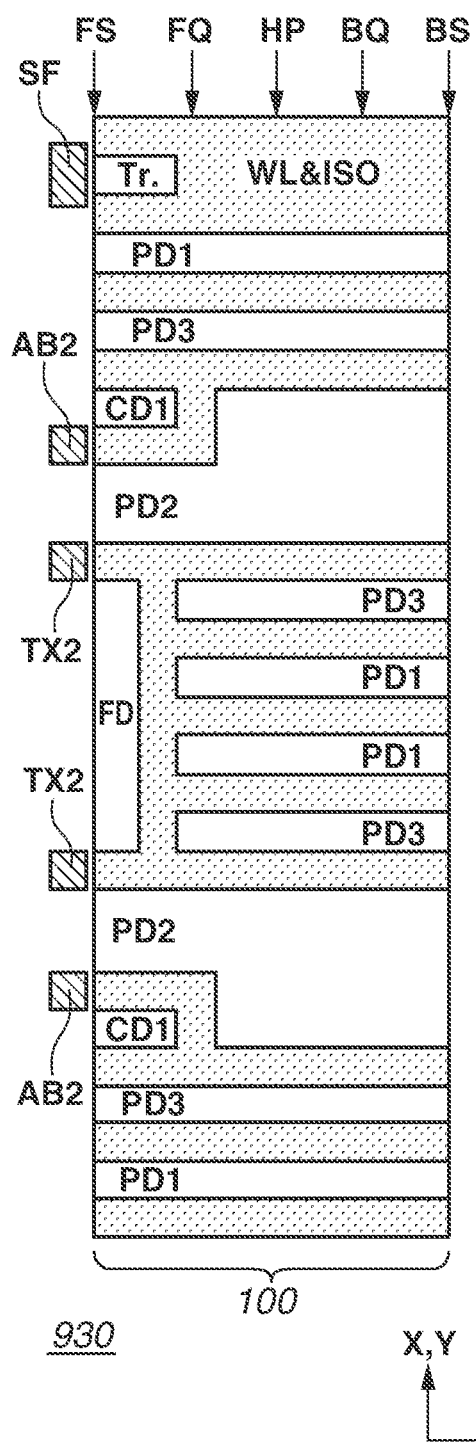
FIG. 15B is a schematic view illustrating an example of a semiconductor apparatus.

A seventh exemplary embodiment will be described below with reference to FIGS. 13 and 15B. According to the seventh exemplary embodiment, the semiconductor apparatus 930 includes the components positioned at the portion W surrounded by the broken lines in FIG. 2, but does not need to include the components positioned at the portion V surrounded by the broken lines in FIG. 2. FIG. 15B is a cross-sectional view taken along the J-J' line in FIG. 13. In the descriptions of the seventh exemplary embodiment, points that can be similar to those in the sixth exemplary embodiment will be omitted. The seventh exemplary embodiment differs from other exemplary embodiments in that the electric charge storage portion FD and/or the electric charge discharge portion CD1 are shared by a plurality of pixels PX1 to PX4.

Figure 13:
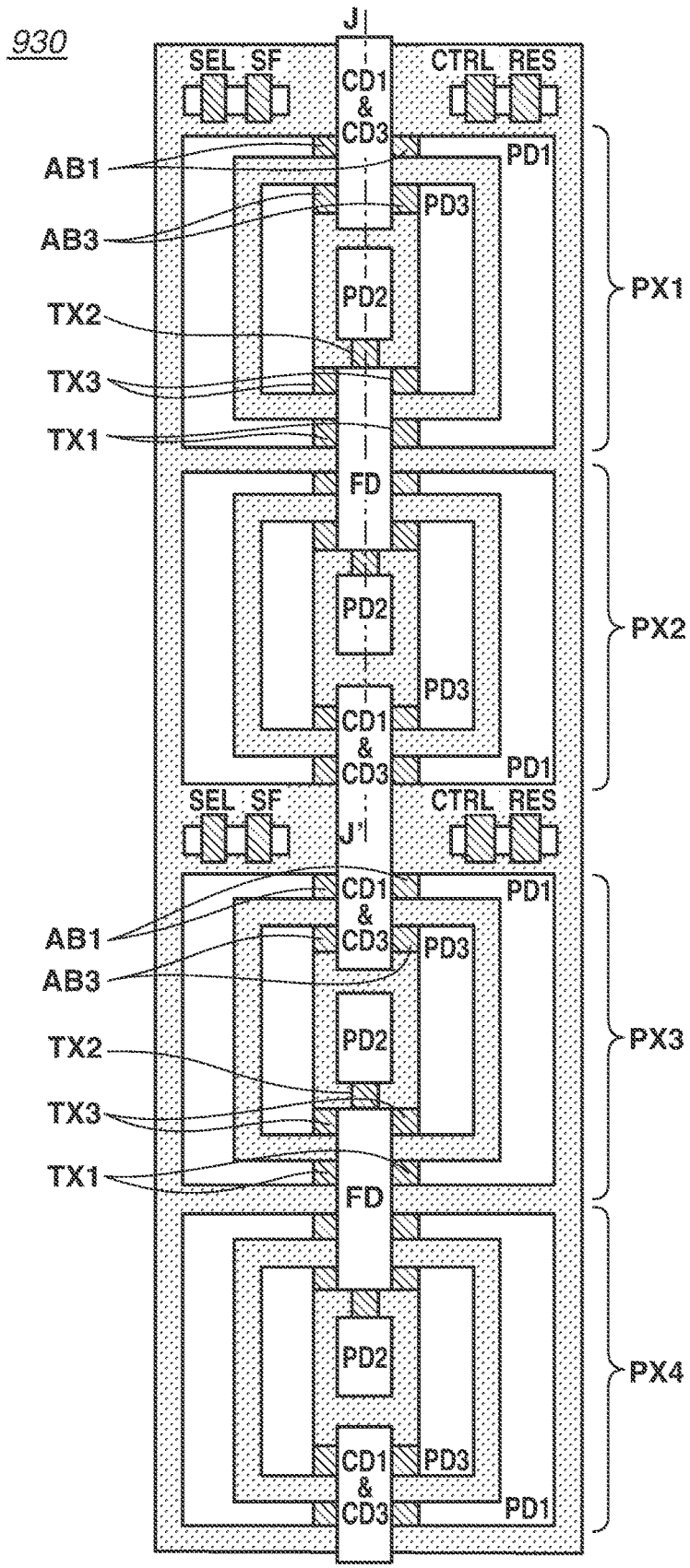
FIG. 13 is a schematic view illustrating an example of a semiconductor apparatus.

FIG. 13 illustrates the four pixels PX1, PX2, PX3, and PX4 each of which includes the photodiodes PD1, PD2, and PD3. The photodiode PD3 has a larger area and a higher sensitivity, and is more likely to be saturated than the photodiode PD2. However, when a signal after the saturation flows into the photodiode PD2, the photodiode PD2 having a low sensitivity will be immediately saturated because of the small area. Therefore, the photodiode PD2 does not effectively operate. Each of the photodiodes PD1 and PD3 is provided with two transfer electrodes AB1 and two transfer electrodes AB3. The photodiodes PD1 and PD3 are separately disposed from the electric charge discharge portions CD1 & CD3 in FIG. 12. The potential barrier can be controlled based on the potentials of the transfer electrodes AB1 and AB3 from the conductive state to the non-conductive state. When the transfer electrodes AB1 or AB3 are turned ON to set a semi-conductive state (intermediate state of the potential barrier) between the photodiode PD1 or PD3 and the electric charge discharge portions CD1 & CD3. In the semi-conductive state, when the electric charges in the photodiodes PD1 and PD3 exceed a predetermined amount, the electric charges leak into the electric charge discharge portions CD1 & CD3. This enables preventing the leakage of electric charges of the photodiodes PD1 and PD3 into adjacent pixels even if the electric charges reach the saturation state. In this way, it is possible to control to prevent the leakage after the saturation between the photodiodes.

Figure 14:
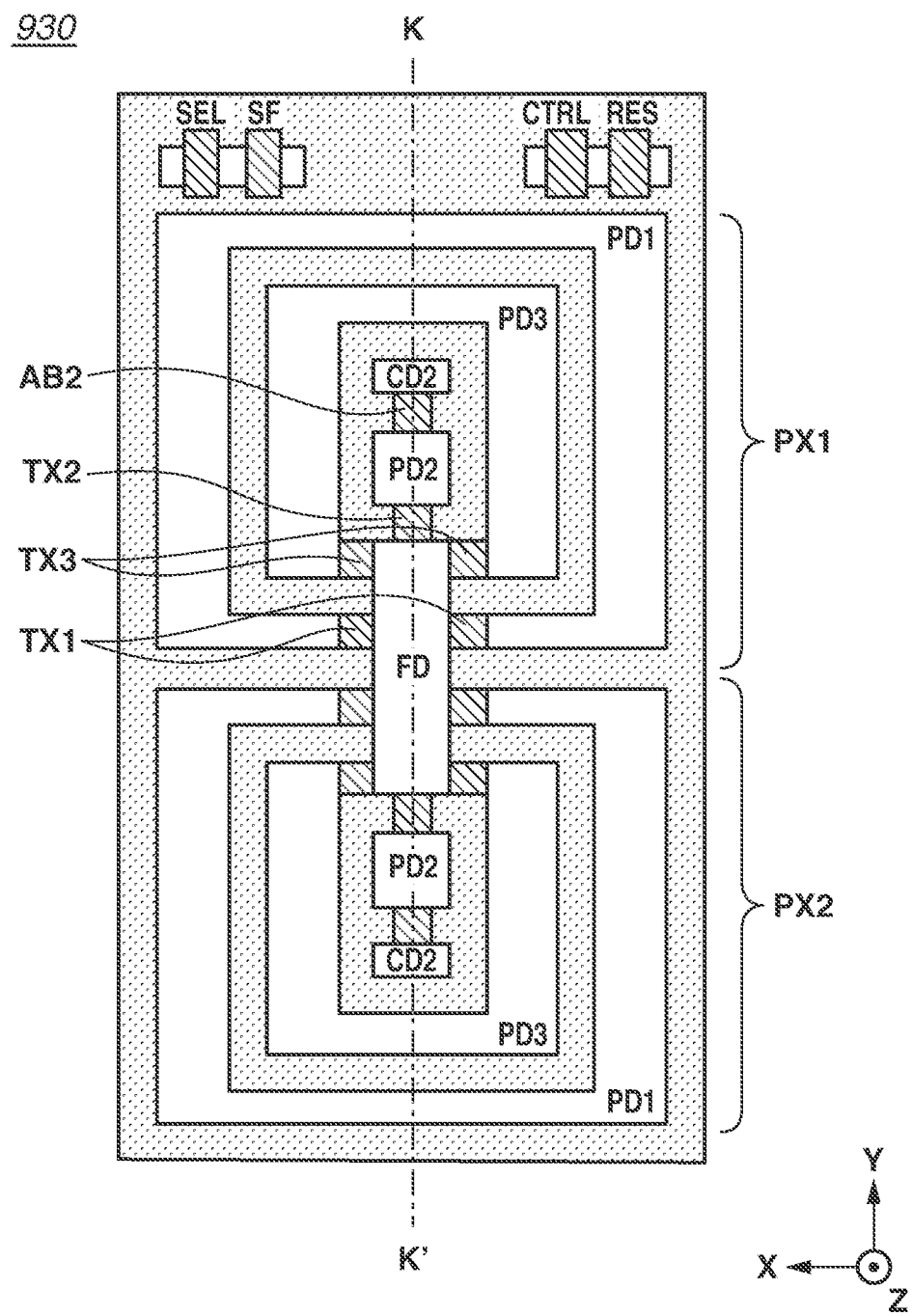
FIG. 14 is a schematic view illustrating an example of a semiconductor apparatus.

FIG. 14 illustrates two pixels. In FIG. 13, the upper two pixels PX1 and PX2 are arranged in translational symmetry to be the lower two pixels PX3 and PX4, but the upper two pixels PX1 and PX2 may be arranged in the mirror symmetry. The electric charge discharge portions CD1 & CD3 are shared by the pixels PX2 and PX3. The electric charge storage portion FD is shared by the pixels PX1 and PX2. The electric charge storage portion FD is shared by the pixels PX3 and PX4. The pixel transistors having the gate electrodes SEL, SF, RES, and CTRL may be shared by the pixels PX2 and PX3 or shared by the pixels PX3 and PX4.

Disposing the electric charge discharge portions CD1 & CD3 may possibly reduce the areas of the photodiodes PD1, PD2, and PD3 by the areas of the electric charge discharge portions CD1 & CD3. However, sharing the electric charge discharge portions CD1 & CD3 by a plurality of pixels enables preventing the reduction of the areas of the photodiodes PD1, PD2, and PD3. Although, in this example, the photodiode PD3 and the electric charge discharge portion CD3 are disposed, the photodiode PD3 and the electric charge discharge portion CD3 may be omitted, and the electric charge discharge portion CD1 may be shared by a plurality of pixels. The sharing unit of the floating diffusion is different from the sharing unit of the regions of the electric charge discharge portions CD1 & CD3. This arrangement enables reducing the occupying ratio of the regions of the electric charge discharge portions CD1 & CD3 to the pixel areas, and enables wiring sharing, making it possible to reduce the number of wirings and reduce the coupling capacitance between wirings. If the electric charge storage portion FD is shared by a plurality of pixels, signal reading becomes slow. Therefore, the electric charge discharge portion CD1 may be shared by a plurality of pixels without sharing the electric charge storage portion FD by a plurality of pixels.

Each of the photodiodes PD1 and PD3 may be provided with one transfer electrode AB1 and one transfer electrode AB3. Since the leakage occurs after the photodiodes are saturated, at least one position needs to be established as a leakage path. In that sense, the number of gates may be one in a case where bilateral symmetry is not required.

Eighth Exemplary Embodiment

An eighth exemplary embodiment will be described below with reference to FIGS. 13 and 15B. FIG. 15B is a cross-sectional view taken along the K-K line in FIG. 14. In the descriptions of the eighth exemplary embodiment, points that can be similar to those in the seventh exemplary embodiment will be omitted. The eighth exemplary embodiment differs from other exemplary embodiments in that the electric charge discharge portion CD2 is provided. According to the eighth exemplary embodiment, the semiconductor apparatus 930 includes the components positioned at the portion W surrounded by the broken lines in FIG. 2, and the components positioned at the portion V surrounded by the broken lines in FIG. 2.

When using a microlens as illustrated in FIG. 1, since vertically incident light gathers at the pixel center, the photodiode PD2 can provide a high sensitivity than the photodiode PD1. It is preferable to prevent the leakage of electric charges to adjacent pixels after the photodiode PD2 having a higher sensitivity is saturated. Therefore, the photodiode PD2 is provided with the electric charge discharge portion CD2 as a leak path after the saturation. This enables reducing the amount of electric charges that leaks to the photodiodes PD1 and PD3 after the photodiode PD2 is saturated.

Ninth Exemplary Embodiment

Figure 16A:
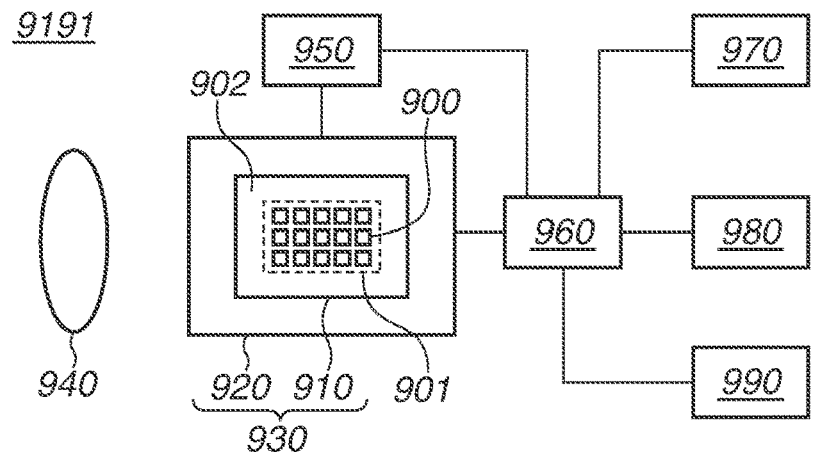
FIG. 16A is a schematic view illustrating an example of a device having the semiconductor apparatus.

A ninth exemplary embodiment is applicable to any of the first to eighth exemplary embodiments. FIG. 16A is a schematic view illustrating a device 9191 including the semiconductor apparatus 930 according to the present exemplary embodiment. The device 9191 including the semiconductor apparatus 930 will be described in detail below. As described above, the semiconductor apparatus 930 can include not only a semiconductor device 910 having the semiconductor layer 10 but also a package 920 that stores the semiconductor device 910. The package 920 can include a base with the semiconductor device 910 fixed thereto, and a lid made of glass that faces the semiconductor device 910. The package 920 can include bonding members such as bonding wires and bumps for connecting the terminals on the base to the terminals on the semiconductor device 910.

The device 9191 can include at least any one of an optical apparatus 940, a control apparatus 950, a processing apparatus 960, a display apparatus 970, a storage device 980, and a mechanical apparatus 990. The optical apparatus 940 is applicable to the semiconductor apparatus 930. The optical apparatus 940 is, for example, a lens, shutter, or mirror. The control apparatus 950 controls the semiconductor apparatus 930. The control apparatus 950 is, for example, a semiconductor apparatus such as an Application Specific Integrated Circuit (ASIC).

The processing apparatus 960 processes the signal output from the semiconductor apparatus 930. The processing apparatus 960 is a semiconductor apparatus such as a Central Processing Unit (CPU) or an ASIC for configuring an Analog Front End (AFE) or a Digital Front End (DFE). The display apparatus 970 is an Electroluminescence (EL) display apparatus or a liquid crystal display apparatus that displays information (images) obtained by the semiconductor apparatus 930. The storage device 980 is a magnetic device or a semiconductor device that stores information (images) obtained by the semiconductor apparatus 930. The storage device 980 is a volatile memory such as a static random access memory (SRAM) or a dynamic random access memory (DRAM), or a nonvolatile memory such as a flash memory or a hard disk drive.

The mechanical apparatus 990 includes a movable unit or a propulsion unit such as a motor or an engine. The device 9191 displays the signal output from the semiconductor apparatus 930 on the display apparatus 970 or transmits the signal to the outside via a communication apparatus (not illustrated) included in the device 9191. Therefore, it is preferable that the device 9191 further includes the storage device 980 and the processing apparatus 960 in addition to the storage circuit and the calculation circuit included in the semiconductor apparatus 930. The mechanical apparatus 990 may be controlled based on the signal output from the semiconductor apparatus 930.

The device 9191 is suitable for electronic devices such as information terminals (e.g., smartphones and wearable terminals) and cameras (e.g., lens exchangeable cameras, compact cameras, video cameras, and surveillance cameras) having image capturing functions. The mechanical apparatus 990 in a camera can drive parts of the optical apparatus 940 for zooming, focusing, and shutter operations. Alternatively, the mechanical apparatus 990 in a camera can move the semiconductor apparatus 930 for image stabilization operations.

The device 9191 may be a transport device such as a vehicle, ship, or aircraft. The mechanical apparatus 990 in a transport device may be used as a moving apparatus. The device 9191 as a transport device is preferable for transportation of the semiconductor apparatus 930 and for assisting and/or automating the driving (operation) through image capturing functions. The processing apparatus 960 for assisting and/or automating the driving (operation) can perform processing for operating the mechanical apparatus 990 as a moving apparatus based on information obtained by the semiconductor apparatus 930. Alternatively, the device 9191 may be a medical apparatus such as an endoscope, a measurement apparatus such as a distance measurement sensor, an analytical apparatus such as an electron microscope, and a business apparatus such as a copying machine.

The above-described exemplary embodiments make it possible to obtain preferable pixel characteristics. Therefore, the value of the semiconductor apparatus can be enhanced. The value enhancement in this case refers to at least any one of functional addition, performance improvement, characteristic improvement, reliability improvement, production yield improvement, environmental load reduction, cost reduction, downsizing, and weight saving.

Therefore, the use of the semiconductor apparatus 930 according to the present exemplary embodiment in the device 9191 also enables improving the value of the device. For example, mounting the semiconductor apparatus 930 on a transport device enables obtaining excellent performance in imaging the outside of the transport device and measuring the external environment. Therefore, in manufacturing and selling a transport device, determining to mount the semiconductor apparatus according to the present exemplary embodiment on a transport device is advantageous in increasing the performance of the transport device itself. In particular, the semiconductor apparatus 930 is preferable in supporting and/or automating the driving of a transport device by using information obtained by the semiconductor apparatus.

Figure 16B:
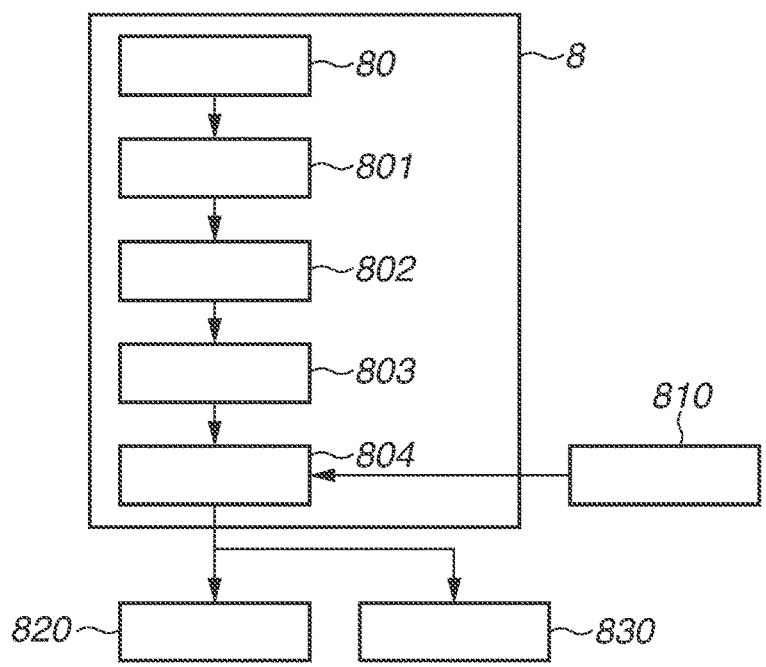
FIG. 16B is a schematic view illustrating an example of a device having the semiconductor apparatus.

FIGS. 16A and 16B are block diagrams illustrating an imaging system related to an in-vehicle camera according to the present exemplary embodiment. An imaging system 8 includes an imaging unit 80 using the semiconductor apparatus according to the above-described exemplary embodiments. The imaging system 8 includes an image processing unit 801 that subjects a plurality of pieces of image data acquired by the imaging unit 80 to image processing, and a parallax calculation unit 802 that calculates the parallax (phase difference of parallax images) based on the plurality of pieces of image data acquired by the imaging system 8. The imaging system 8 also includes a distance measurement unit 803 that calculates the distance to a target object based on the calculated parallax, and a collision determination unit 804 that determines the possibility of collision based on the calculated distance. The parallax calculation unit 802 and the distance measurement unit 803 are examples of distance information acquisition units that acquire information about the distance to the target object. More specifically, the distance information refers to information about the parallax, the defocus amount, and the distance to the target object. The collision determination unit 804 may determine the possibility of collision by using any one of these pieces of distance information. The distance information acquisition unit may be implemented by a dedicated hardware component or implemented by a software module. The distance information acquisition unit may also be implemented by a Field Programmable Gate Array (FPGA), an Application Specific Integrated Circuit (ASIC), or a combination of both.

The imaging system 8 is connected with a vehicle information acquisition apparatus 810 to acquire vehicle information such as the vehicle speed, yaw rate, and steering angle. The imaging system 8 is also connected with a control Electronic Control Unit (ECU) 820 as a control apparatus that outputs control signals for generating a braking force on a vehicle based on the determination result by the collision determination unit 804. The imaging system 8 is also connected with an alarm apparatus 830 that generates an alarm to the driver based on the determination result by the collision determination unit 804. For example, if the possibility of collision is high based on the determination result by the collision determination unit 804, the control ECU 820 performs vehicle control to avoid a collision and reduce damages, for example, by applying brakes, releasing the accelerator, or restraining the engine power. The alarm apparatus 830 warns the user by generating an alarm sound, displaying alarm information on the screen of the car navigation system, or applying a vibration to the seat belt or steering wheel. As described above, the imaging system 8 functions as a control unit that controls the operations for controlling the vehicle.

Figure 16C:
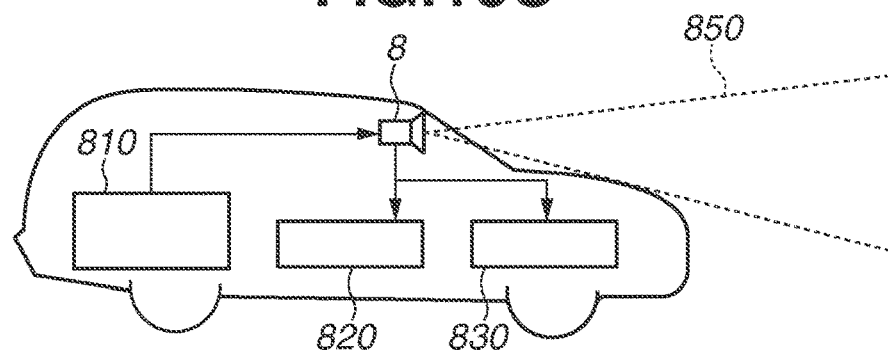
FIG. 16C is a schematic view illustrating an example of a device having the semiconductor apparatus.

According to the present exemplary embodiment, the imaging system 8 captures images of the surrounding of the vehicle, for example, images ahead of or behind the vehicle. FIG. 16C illustrates an imaging system that captures images ahead of the vehicle (imaging range 850). The vehicle information acquisition apparatus 810 as an imaging control unit transmits an instruction to the imaging system 8 or the imaging unit 80 to perform the operations according to the above-described first to seventh exemplary embodiments. The above-described configuration enables improving the accuracy of distance measurement.

Although the present exemplary embodiment has been described above centering on driving support control for avoiding a collision with other vehicles, the present exemplary embodiment is also applicable to automated driving control for following another vehicle and automated driving control for retaining the vehicle within the lane. The semiconductor apparatus 930 is also applicable to a drive recorder. The imaging system is applicable not only to vehicles such as the own vehicle but also to moving bodies (moving apparatuses) such as vessels, airplanes, artificial satellites, industrial robots, and consumer robots. In addition, the imaging system is applicable not only to moving bodies but also to intelligent transport systems (ITS's), monitoring systems, and a wide range of apparatuses utilizing object recognition or biometric recognition.

The present invention is not limited to the above-described exemplary embodiments but can be modified in diverse ways. For example, the present invention also includes an exemplary embodiment in which a part of the configuration of another exemplary embodiment is appended, or an exemplary embodiment in which a part of the configuration is replaced with a part of the configuration of another exemplary embodiment.

The present invention may be appropriately changed without departing from the technical ideal thereof. The disclosure of the present specification includes not only the descriptions of the present specification but also all of the contents prehensible from the present specification and the drawings attached to the present specification. The disclosure of the present specification includes a complementary set of the concepts described in the present specification. More specifically, if the present specification includes a description "A is larger than B", for example, the present specification discloses a description "A is not larger than B" even if a description "A is not larger than B" is omitted. This is because the description "A is larger than B" premises the consideration of a case where "A is not larger than B".

The present invention is not limited to the above embodiments and various changes and modifications can be made within the spirit and scope of the present invention. Therefore, to apprise the public of the scope of the present invention, the following claims are made.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The present invention enables providing a technique that is advantageous in obtaining preferable pixel characteristics in a semiconductor apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A semiconductor apparatus comprising a semiconductor layer having a plurality of pixels arranged in a matrix form and a light shielded portion, and having a front surface and a back surface,
    wherein one of the plurality of pixels includes a plurality of photodiodes disposed in the semiconductor layer,
    wherein nine sections, obtained by dividing a light receiving region of the one pixel on the back surface of the semiconductor layer into three equal sections in each of row and column directions, include a first section and eight sections (including a second section, a third section, a fourth section, a fifth section, a sixth section, a seventh section, an eighth section, and a ninth section), and the first section is positioned between the second and third sections and between the fourth and fifth sections, wherein a first photoelectric conversion member included in a certain photodiode of the plurality of photodiodes is disposed at a position overlapping with the first section in a direction perpendicular to the back surface, wherein a second photoelectric conversion member included in a photodiode different from the certain photodiode is disposed at a position overlapping with the second section in the direction perpendicular to the back surface, wherein a third photoelectric conversion member included in a photodiode different from the certain photodiode is disposed at a position overlapping with the third section in the direction perpendicular to the back surface, wherein a plurality of electrodes each forming a Metal-Insulator-Semiconductor (MIS) structure together with the semiconductor layer is disposed on the front surface of the semiconductor layer, wherein at least one of the plurality of electrodes overlaps with at least one of the eight sections in the direction perpendicular to the back surface, and wherein at least one of the electrodes associated with the one pixel out of the plurality of electrodes and an element region of the semiconductor layer forming the MIS structure is disposed in a region overlapping with the light shielded portion in a direction perpendicular to the front surface, wherein the plurality of electrodes includes a first transfer electrode for transferring electric charges generated in the first photoelectric conversion member to an electric charge storage portion disposed in the semiconductor layer and a second transfer electrode for transferring electric charges generated in the second photoelectric conversion member to the electric charge storage portion, and wherein the electric charge storage portion is arranged between the first transfer electrode and the second transfer electrode in the direction perpendicular to the front surface.

2. The semiconductor apparatus according to claim 1, wherein at least one of the plurality of electrodes overlaps with the first section in the direction perpendicular to the back surface.

3. The semiconductor apparatus of claim 1,
wherein an element separation portion having a Shallow-Trench-Isolation (STI) structure is disposed on the front surface side of the semiconductor layer, and
wherein at least one of the plurality of electrodes overlaps with at least one of the eight sections in the direction perpendicular to the back surface and overlaps with the element separation portion in the direction perpendicular to the front surface.

4. The semiconductor apparatus according to claim 1, wherein the first transfer electrode overlaps with the first section in the direction perpendicular to the back surface.

5. The semiconductor apparatus according to claim 1,
wherein, in a range where a distance from the front surface is D or larger and less than 3×D, a first semiconductor region of a first conductivity type is disposed to overlap with the eight sections in the direction perpendicular to the back surface,
wherein, in a range where the distance from the front surface is less than D, a second semiconductor region of a second conductivity type is disposed between the first semiconductor region and the front surface in the direction perpendicular to the front surface, wherein a third semiconductor region of the first conductivity type is disposed between the first semiconductor region and the front surface in the direction perpendicular to the front surface, and wherein a distance between the front and back surfaces is T, and D=T/4.

6. The semiconductor apparatus according to claim 1, wherein the first transfer electrode overlaps with at least one of the eight sections in the direction perpendicular to the back surface.

7. The semiconductor apparatus according to claim 1, wherein a contact plug connected to the electric charge storage portion overlaps with the first section in the direction perpendicular to the back surface.

8. The semiconductor apparatus according to claim 1,
wherein the plurality of electrodes includes a capacitor electrode forming an MIS type capacitor connected to the electric charge storage portion, and
wherein the capacitor electrode overlaps with at least two of the eight sections in the direction perpendicular to the back surface.

9. The semiconductor apparatus according to claim 1,
wherein the plurality of electrodes includes a third transfer electrode for transferring the electric charges generated in the second photoelectric conversion member to an electric charge discharge portion disposed in the semiconductor layer, and
wherein the third transfer electrode overlaps with at least one of the eight sections in the direction perpendicular to the back surface.

10. The semiconductor apparatus according to claim 9, wherein the second and third transfer electrodes overlap with the fourth section in the direction perpendicular to the back surface.

11. The semiconductor apparatus according to claim 9, wherein a contact plug connected to the electric charge discharge portion is in contact with a region not overlapping with the light receiving region out of the front surface of the semiconductor layer in the direction perpendicular to the front surface.

12. The semiconductor apparatus according to claim 9,
wherein the plurality of electrodes includes a fourth transfer electrode for transferring electric charges generated in the third photoelectric conversion member to the electric charge storage portion, and
wherein a contact plug connected to the electric charge storage portion is positioned between the third and fourth transfer electrodes.

13. The semiconductor apparatus according to claim 9, wherein at least either one of the electric charge storage portion and the electric charge discharge portion is shared by another pixel different from the one pixel.

14. The semiconductor apparatus according to claim 1, wherein the contact plug connected to the electric charge storage portion is positioned between the first and second transfer electrodes.

15. The semiconductor apparatus according to claim 5,
wherein the first semiconductor region includes a first portion overlapping with the fourth section in the direction perpendicular to the back surface, a second portion overlapping with the second section in the direction perpendicular to the back surface, and a third portion overlapping with the fifth section in the direction perpendicular to the back surface, and wherein an impurity density of the first portion is higher than an impurity density of the second portion, and an impurity density of the third portion is lower than the impurity density of the second portion.

16. The semiconductor apparatus according to claim 5, wherein the second semiconductor region surrounds the first semiconductor region.

17. The semiconductor apparatus according to claim 1, wherein a plurality of microlenses is disposed above the back surface, and
wherein one of the plurality of microlenses overlaps with at least four of the nine sections in the direction perpendicular to the back surface.

18. The semiconductor apparatus according to claim 1, wherein the plurality of photodiodes includes first and second photodiodes having a nested structure, the first photodiode includes the first photoelectric conversion member, and the second photodiode includes the second and third photoelectric conversion members.

19. The semiconductor apparatus according to claim 18, wherein one of the plurality of electrodes is a gate electrode of an amplifying transistor for generating a signal based on electric charges of the first photodiode and a signal based on electric charges of the second photodiode.

20. The semiconductor apparatus according to claim 1, wherein the plurality of electrodes overlaps with the element region and a semiconductor region adjacent to the element region in the direction perpendicular to the front surface, the semiconductor region having the conductivity type different from that of the element region.

21. The semiconductor apparatus according to claim 1, wherein at least two of the plurality of electrodes and at least the two element regions forming the MIS structure are disposed in a region overlapping with the light shielded portion in the direction perpendicular to the front surface.

22. The semiconductor apparatus according to claim 21, wherein a separation region that separates the element regions is disposed between the MIS structures including the at least two element regions, and
wherein the separation region is disposed in the region overlapping with the light shielded portion in the direction perpendicular to the front surface.

23. A device having the semiconductor apparatus according to claim 1, the device comprising at least any one of the following:
an optical apparatus configured to be applicable to the semiconductor apparatus;
a control apparatus configured to control the semiconductor apparatus;
a processing apparatus configured to process a signal output from the semiconductor apparatus;
a display apparatus configured to display information obtained by the semiconductor apparatus;
a storage device configured to store the information obtained by the semiconductor apparatus; and
a mechanical apparatus configured to operate based on the information obtained by the semiconductor apparatus.

24. A transport device comprising:
the semiconductor apparatus according to claim 1; and
a mechanical apparatus configured to move the semiconductor apparatus.

25. The transport device according to claim 24, wherein driving of the transport device is supported and/or automated by using information obtained by the semiconductor apparatus.

26. The semiconductor apparatus according to claim 1, wherein a plurality of microlenses are disposed above the back surface, and
wherein each of the plurality of microlenses overlaps with a different one of the plurality of pixels in the direction perpendicular to the back surface.

27. The semiconductor apparatus according to claim 1, wherein the plurality of photodiodes includes first and second photodiodes, the first photodiode includes the first photoelectric conversion member, and the second photodiode includes the second and third photoelectric conversion members,
wherein one of the plurality of electrodes is a gate electrode of an amplifying transistor for generating a signal based on electric charges of the first photodiode and a signal based on electric charges of the second photodiode, and
wherein the gate electrode of the amplifying transistor overlaps with the one of the plurality of pixels in the direction perpendicular to the front surface.

* * * * *